(12) United States Patent
Shamir et al.

(10) Patent No.: US 10,986,601 B2
(45) Date of Patent: Apr. 20, 2021

(54) SYSTEM AND METHOD FOR TIMING SYNCHRONIZATION OF A SELF-POWERED POWER SENSOR

(71) Applicant: Panoramic Power Ltd., Kfar-Saba (IL)

(72) Inventors: Adi Shamir, Kidron (IL); Daniel Aljadeff, Kiriat Ono (IL)

(73) Assignee: Panoramic Power Ltd., Kfar-Saba (IL)

( * ) Notice: Subject to any disclaimer, the term of this patent is extended or adjusted under 35 U.S.C. 154(b) by 0 days.

(21) Appl. No.: 15/940,403

(22) Filed: Mar. 29, 2018

(65) Prior Publication Data

US 2019/0037515 A1    Jan. 31, 2019

Related U.S. Application Data

(60) Provisional application No. 62/537,330, filed on Jul. 26, 2017.

(51) Int. Cl.
*H04W 56/00* (2009.01)
*G01R 22/06* (2006.01)
(Continued)

(52) U.S. Cl.
CPC ........ *H04W 56/0065* (2013.01); *G01D 21/00* (2013.01); *G01R 19/02* (2013.01);
(Continued)

(58) Field of Classification Search
CPC .. H04W 56/0065; H04W 24/08; H04L 69/324
See application file for complete search history.

(56) References Cited

U.S. PATENT DOCUMENTS 3,517,311 A    6/1970  Wasielewski et al.
4,709,339 A   11/1987  Fernandes
(Continued)

FOREIGN PATENT DOCUMENTS

CN    105137144 A    12/2015
EP      1703289 B1   11/2010
(Continued)

OTHER PUBLICATIONS

International Search Report and Written Opinion of International Searching Authority for PCT/US2018/025209, ISA/RU, Moscow, Russia, dated Jul. 12, 2018.
(Continued)

*Primary Examiner* — Hassan Kizou
*Assistant Examiner* — Hector Reyes
(74) *Attorney, Agent, or Firm* — M&B IP Analysts, LLC

(57) ABSTRACT

A system and method for the wireless synchronization of a self-powered power sensor (SPPS) to a central controller for calculating a value of an electrical parameter. The method includes receiving from a central controller a message that includes timing information of the central controller time base; sampling at least an electrical signal respective of a powerline connected to an SPPS; estimating from the samples of the at least an electrical signal at least a first electrical parameter, where the at least a first electrical parameter is adjusted using the timing information; generating a packet; appending to the packet the estimated at least a first electrical parameter; and transmitting the packet to the central controller.

27 Claims, 9 Drawing Sheets

(51) Int. Cl.
*G01D 21/00* (2006.01)
*H04J 3/06* (2006.01)
*G01R 19/02* (2006.01)
*G01R 19/175* (2006.01)
*G01R 25/00* (2006.01)
*H04L 29/08* (2006.01)
*H04W 24/08* (2009.01)

(52) U.S. Cl.
CPC ......... *G01R 19/175* (2013.01); *G01R 22/063* (2013.01); *G01R 25/005* (2013.01); *H04J 3/0664* (2013.01); *H04L 69/324* (2013.01); *H04W 24/08* (2013.01)

(56) References Cited

U.S. PATENT DOCUMENTS

| | | | |
|---|---|---|---|
| 5,006,846 | A | 4/1991 | Granville et al. |
| 5,892,430 | A | 4/1999 | Wiesman et al. |
| 5,995,911 | A | 11/1999 | Hart |
| 6,018,700 | A | 1/2000 | Edel |
| 6,160,697 | A | 12/2000 | Edel |
| 6,198,403 | B1 * | 3/2001 | Dorrough .......... G01R 19/2513 324/103 R |
| 6,259,372 | B1 | 7/2001 | Taranowski et al. |
| 6,417,661 | B1 | 7/2002 | Berkcan et al. |
| 6,433,981 | B1 | 8/2002 | Fletcher et al. |
| 6,470,283 | B1 | 10/2002 | Edel |
| 6,727,684 | B2 | 4/2004 | Hatanaka |
| 6,756,776 | B2 | 6/2004 | Perkinson et al. |
| 6,798,209 | B2 | 9/2004 | Lavoie et al. |
| 6,825,650 | B1 | 11/2004 | McCormack et al. |
| 7,010,438 | B2 | 3/2006 | Hancock et al. |
| 7,058,524 | B2 | 6/2006 | Hayes et al. |
| 7,072,779 | B2 | 7/2006 | Hancock et al. |
| D534,120 | S | 12/2006 | Ricci et al. |
| 7,145,322 | B2 | 12/2006 | Solveson et al. |
| 7,242,157 | B1 | 7/2007 | Edel |
| 7,253,602 | B2 | 8/2007 | Shvach et al. |
| 7,282,944 | B2 | 10/2007 | Gunn et al. |
| 7,321,226 | B2 | 1/2008 | Yakymyshyn et al. |
| 7,436,641 | B2 | 10/2008 | Holley |
| 7,453,267 | B2 | 11/2008 | Westbrock et al. |
| 7,463,986 | B2 | 12/2008 | Hayes |
| 7,557,563 | B2 | 7/2009 | Gunn et al. |
| 7,561,035 | B2 | 7/2009 | Sahashi et al. |
| 7,876,086 | B2 | 1/2011 | Jansen et al. |
| 8,022,690 | B2 | 9/2011 | Kagan |
| 8,085,819 | B2 | 12/2011 | Kiran et al. |
| 8,095,080 | B2 | 1/2012 | Rofougaran |
| 8,190,101 | B2 | 5/2012 | Rofougaran |
| 8,421,444 | B2 | 4/2013 | Gunn |
| 8,447,243 | B2 | 5/2013 | Rofougaran |
| 8,526,893 | B2 | 9/2013 | Rofougaran |
| 8,782,453 | B2 | 7/2014 | Kim et al. |
| 9,077,315 | B2 | 7/2015 | Bogdan |
| 9,134,348 | B2 | 9/2015 | Shamir |
| 9,429,974 | B2 | 8/2016 | Forbes |
| 9,439,218 | B2 | 9/2016 | Kats et al. |
| 9,853,498 | B2 | 12/2017 | Hansell et al. |
| 10,436,825 | B2 | 10/2019 | Shamir et al. |
| 10,512,052 | B2 | 12/2019 | Shamir et al. |
| 2003/0014678 | A1 | 1/2003 | Ozcetin et al. |
| 2005/0206530 | A1 | 9/2005 | Cumming et al. |
| 2006/0119344 | A1 | 6/2006 | Benke et al. |
| 2006/0224335 | A1 | 10/2006 | Borleske et al. |
| 2006/0224336 | A1 | 10/2006 | Petras et al. |
| 2007/0059986 | A1 | 3/2007 | Rockwell |
| 2007/0136010 | A1 | 6/2007 | Gunn et al. |
| 2008/0077336 | A1 | 3/2008 | Fernandes |
| 2008/0122642 | A1 | 5/2008 | Radtke et al. |
| 2008/0266056 | A1 | 10/2008 | Alomar |
| 2008/0312851 | A1 * | 12/2008 | Kagan .................. G01D 4/002 702/60 |
| 2009/0051557 | A1 | 2/2009 | Beatty et al. |
| 2009/0112496 | A1 | 4/2009 | Suzuki |
| 2009/0115403 | A1 | 5/2009 | Bernklau |
| 2009/0115509 | A1 | 5/2009 | Minteer |
| 2009/0167291 | A1 | 7/2009 | Richeson et al. |
| 2009/0167547 | A1 | 7/2009 | Gilbert |
| 2009/0289506 | A1 | 11/2009 | Harres |
| 2010/0153036 | A1 | 6/2010 | Elwarry et al. |
| 2010/0264906 | A1 | 10/2010 | Shamir et al. |
| 2011/0082599 | A1 | 4/2011 | Shinde et al. |
| 2011/0128656 | A1 | 6/2011 | Kohler |
| 2011/0208450 | A1 | 8/2011 | Salka et al. |
| 2012/0062249 | A1 * | 3/2012 | Shamir ................ G01R 15/186 324/679 |
| 2012/0065907 | A1 * | 3/2012 | Kozakai ............ G01R 19/2513 702/57 |
| 2012/0208479 | A1 | 8/2012 | Pistor et al. |
| 2014/0200843 | A1 | 7/2014 | Shamir et al. |
| 2014/0247892 | A1 | 9/2014 | Williams et al. |
| 2014/0340236 | A1 * | 11/2014 | Rhoads .................. G08C 19/12 340/870.02 |
| 2015/0276829 | A1 | 10/2015 | Shamir et al. |
| 2015/0331024 | A1 * | 11/2015 | Bruel ..................... G01R 21/06 324/142 |
| 2015/0369848 | A1 | 12/2015 | Shamir |
| 2016/0231361 | A1 | 8/2016 | Shamir et al. |
| 2016/0353238 | A1 | 12/2016 | Gherardi et al. |
| 2016/0374043 | A1 | 12/2016 | Wetterwald et al. |
| 2017/0005533 | A1 | 1/2017 | Zeine et al. |
| 2017/0030952 | A1 | 2/2017 | Shamir et al. |
| 2018/0031617 | A1 * | 2/2018 | Rieken .................. G01D 4/004 |
| 2018/0128859 | A1 | 5/2018 | Shamir et al. |
| 2018/0139021 | A1 | 5/2018 | Atungsiri |
| 2018/0292447 | A1 * | 10/2018 | Piyasinghe .......... G01R 31/088 |
| 2019/0033354 | A1 | 1/2019 | Shamir et al. |
| 2019/0037515 | A1 | 1/2019 | Shamir et al. |

FOREIGN PATENT DOCUMENTS

| | | |
|---|---|---|
| GB | 2338790 A | 12/1999 |
| GB | 2543685 A | 4/2017 |
| WO | 1999043010 A2 | 8/1999 |
| WO | 2010068582 A1 | 6/2010 |

OTHER PUBLICATIONS ntemational Search Report and Written Opinion of International Searching Authority for PCT/US2018/030205, ISA/RU, Moscow, Russia, dated Aug. 9, 2018.

International Search Report and Written Opinion of the International Searching Authority for PCT/US2018/024835, ISA/RU, Moscow, Russia, dated Jul. 16, 2018.

"International Search Report and Written Opinion of the International Searching Authority dated Aug. 10, 2010", International Application No. PCT/IB2010/000846.

"International Search Report and Written Opinion of the International Searching Authority dated May 16, 2012, International Application No. PCT/IL2012/00013", (dated May 16, 2012).

"Notice of Allowance dated Jan. 14, 2014; United Kingdom Patent Application No. 1307220.2", (dated Jan. 14, 2014).

"Notice of Allowance dated Jan. 28, 2014; United Kingdom Patent Application No. 1316868.7", (dated Jan. 28, 2014).

"Notice of Allowance dated Jan. 7, 2014; United Kingdom Patent Application No. 1119518.7", (dated Jan. 7, 2014).

"Notice of Allowance dated Jun. 1, 2015; Chinese Patent Application No. 201080025086.3", (dated Jun. 1, 2015).

"Office Action dated Aug. 19, 2014; Chinese Patent Application No. 201080025086.3", (dated Aug. 19, 2014).

"Office Action dated Feb. 13, 2015; Chinese Patent Application No. 201080025086.3", (dated Feb. 13, 2015).

"Office Action dated Feb. 19, 2013; United Kingdom Patent Application No. 1119518.7", (dated Feb. 19, 2013).

"Office Action dated Feb. 24, 2014; U.S. Appl. No. 12/760,867", (dated Feb. 24, 2014).

"Office Action dated Jan. 23, 2013; U.S. Appl. No. 12/760,867", (dated Jan. 23, 2013).

(56) References Cited

OTHER PUBLICATIONS

"Office Action dated May 2, 2014; U.S. Appl. No. 12/760,867", (dated May 2, 2014).
"Office Action dated May 24, 2013; United Kingdom Patent Application No. 1119518.7", (dated Jul. 24, 2013).
"Office Action dated May 24, 2013; United Kingdom Patent Application No. 1307220.2", (dated May 24, 2013).
"Office Action dated Nov. 11, 2013; Chinese Patent Application No. 201080025086.3", (dated Nov. 11, 2013).
"Office Action dated Nov. 8, 2013; U.S. Appl. No. 12/160,867", (dated Nov. 8, 2013).
"Office Action dated Oct. 27, 2014; U.S. Appl. No. 12/760,867", (dated Oct. 27, 2014).
"Office Action dated Oct. 29, 2013; United Kingdom Patent Application No. 1119518.7", (dated Oct. 29, 2013).
"Office Action dated Oct. 29, 2013; United Kingdom Patent Application No. 1307220.2", (dated Oct. 29, 2013).
"Office Action dated Oct. 29, 2013; United Kingdom Patent Application No. 1316868.7", dated Oct. 29, 2013).
"Office Action dated Sep. 19, 2013; German Patent Application No. 112010001638.0", (dated Sep. 19, 2013).
"Office Action dated Sep. 20, 2012; U.S. Appl. No. 12/760,867", (dated Sep. 20, 2012).
The First Office Action for Chinese Patent Application No. 2018800624548 dated Sep. 2, 2020, CNIPA, Beijing, China.
The Second Office Action for Chinese Patent Application No. 2018800624548 dated Nov. 25, 2020, CNIPA, Beijing, China.

\* cited by examiner

SYSTEM AND METHOD FOR TIMING SYNCHRONIZATION OF A SELF-POWERED POWER SENSOR

CROSS-REFERENCE TO RELATED APPLICATIONS

This application claims the benefit of U.S. Provisional Application No. 62/537,330 filed on Jul. 26, 2017, the contents of which are hereby incorporated by reference.

TECHNICAL FIELD

The present disclosure relates generally to self-powered power sensors (SPPSs) and more specifically to accurately synchronizing SPPSs with a central controller for measuring power consumption when using wireless SPPSs.

BACKGROUND

The use of self-powered power sensors (SPPSs) placed at a plurality of locations within a facility's electrical grid allows for the remote measurement of power consumption throughout the grid. Typically, such SPPSs are positioned at points of interest of power consumption, such as at circuit breakers or at higher power consumption devices.

FIG. 1 is a block diagram of an exemplary SPPS 100 that includes a current transformer (CT) 103 having its primary winding accepting the primary current 102. It further includes an analog-to-digital converter (ADC or A/D) 105 that converts the analog signal into a series of digital samples under the control of a clock or timer 113 and a microcontroller (MC) 107. The samples gathered by the ADC 105 are processed by the MC 107 and then, using a transceiver 109, the processed information is transmitted using an antenna 116. An oscillator 110 oscillates at a desired frequency and feeds to the clock or timer 113.

FIG. 2 is a block diagram of a modified SPPS 200 that includes the same basic elements as described for the SPPS 100 depicted in FIG. 1. The modified SPPS 200 further includes a low pass filter (LPF) 202 coupled to the CT 103 and ADC 105. In one embodiment, LPF 202 is an analog filter. The input current 201 may be derived from the CT 103. The LPF 202 may be implemented in many different ways including, but not limited to, passive or active filters, matched filters, or harmonic filters. According to one embodiment, as shown in FIG. 2, the filtered signal 203 is fed to the ADC 105. The MC 107 can select which signal shall be sampled (i.e., an input signal 104 or a filtered signal 203). In other embodiments, the ADC 105 includes two channels, where both signals can be sampled simultaneously. According to one embodiment, the LPF 202 can be activated only when sampling the fundamental signal 203, thereby saving power consumption.

FIG. 3 is a block diagram of yet another modified SPPS 300 that includes the same basic elements as described for the modified SPPS 200 depicted in FIG. 2. The SPPS 300 further includes a zero-crossing (or zero-cross) detector circuit 301 connected to the LPF 202 and the clock or timer 113. The filtered signal 203 is fed to a zero-crossing detection circuit 301 that generates a signal 302 relative to the zero-crossing time of the filtered signal 203. Further, according to this embodiment, the generated signal 302 may be time-stamped by, for example, the clock or timer 113. According to one embodiment, the zero-crossing detection circuit 301 may include a comparator to avoid significant errors in the zero-crossing detection.

Regardless of these and other embodiments for determining power consumption, the currently available SPPSs allow for only limited accuracy of measurement. That is, to accurately measure the power consumption of a load it is necessary to measure the power factor. Such a factor contains information of the phase difference between the voltage and the load current, as well as the distortion of the load current and voltage from a pure sinusoidal wave. In previous power measuring systems, voltage and current are simultaneously measured by the same physical device and therefore the relationship between the two signals is easy to calculate and measure. However, when there is a wireless connection between the current and voltage sampling, accurate measurement requires additional innovation to overcome the deficiencies of wireless SPPSs for measuring power consumption accurately.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "certain embodiments" may be used herein to refer to a single embodiment or multiple embodiments of the disclosure.

Certain embodiments disclosed herein include a method for the wireless synchronization of a self-powered power sensor (SPPS) to a central controller for calculating a value of an electrical parameter. The method includes: receiving from a central controller a message that includes timing information of the central controller time base; sampling at least an electrical signal respective of a powerline connected to an SPPS; estimating from the samples of the at least an electrical signal at least a first electrical parameter, where the at least a first electrical parameter is adjusted using the timing information; generating a packet; appending to the packet the estimated at least a first electrical parameter; and transmitting the packet to the central controller.

Certain embodiments disclosed herein also include a self-powered power sensor (SPPS) adapted to calculate a value of at least an electrical parameter. The SPPS includes a current transformer where a primary winding of the current transformer is configured to connect to a powerline; an analog-to-digital converter (ADC) connected to a secondary winding of the current transformer; a wireless transceiver; a processing unit connected to the ADC and adapted to: receive from a central controller a message including timing information of the central controller time base; sample at least an electrical signal respective of a powerline; estimate from the samples of the at least an electrical signal at least a first electrical parameter, where the at least a first electrical parameter is adjusted using the timing information; generate a packet; append to the packet the estimated at least a first electrical parameter; and transmit the packet to the central controller; and a clock connected to an oscillator, wherein the clock is connected to the ADC, the processing unit and the transmitter.

Certain embodiments disclosed herein also include a central controller for providing information to and receiving information from a plurality of self-powered power sensors (SPPSs), the central controller including: an interface to accept a powerline for sampling a voltage signal of the powerline; a transceiver adapted to transmit wireless signals to the plurality of SPPSs and receive wireless signals from the plurality of SPPSs; a timer for determination of a time base of the central controller; a processing unit connected to the interface, the transceiver, the timer and a memory containing instructions that when executed by the processing unit adapt the central controller to: determine at least a voltage information respective of a voltage signal of the power line; obtain timing information of the time base; create a packet containing the timing information of the time base; transfer the packet to the transmitter for transmission to the plurality of SPPSs such that each SPPS may adjust its respective time base timing according to the timing information of the time base of the central controller; receive from at least one SPPS from the plurality of SPPS a first electrical parameter and a second electrical parameter; and, determine a power factor based on the voltage signal, the first electrical parameter and the second electrical parameter; and one or more antennas connected to the transceiver for wireless communication with the plurality of SPPSs.

Certain embodiments disclosed herein also include a non-transitory computer readable medium having stored thereon instructions for causing a processing circuitry to perform a process, the process including: receiving from a central controller a message that includes timing information of the central controller time base; sampling at least an electrical signal respective of a powerline connected to an SPPS; estimating from the samples of the at least an electrical signal at least a first electrical parameter, where the at least a first electrical parameter is adjusted using the timing information; generating a packet; appending to the packet the estimated at least a first electrical parameter; and transmitting the packet to the central controller.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
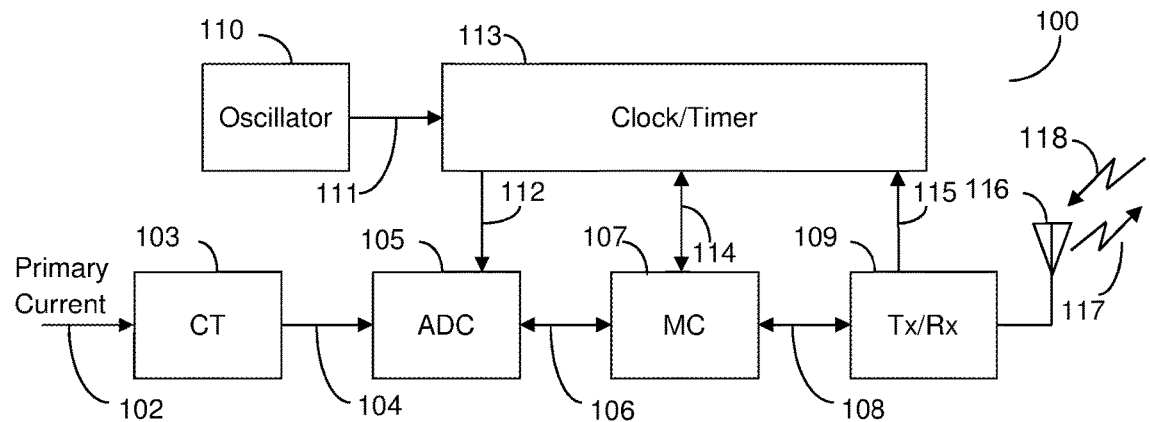
FIG. 1 is a first exemplary self-powered power sensor (SPPS) (prior art).

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

Some example disclosed embodiments include a method and system for a self-powered power sensor (SPPS) to sample at least a current signal. The SPPS is further adapted to receive timing information from a central controller to which it is wirelessly connected. The SPPS is configured to determine the current's root mean square (RMS) values to ensure an accurate determination of the input current electrical parameters. The time-based timing information of the central controller is provided to the SPPS to ensure that time synchronization is achieved between the central controller and the SPPS when calculations of the electrical parameters take place. In one embodiment, the SPPS then returns the calculated input current electrical parameters over a wireless communication link established between the SPPS and the central controller.

FIG. 1 depicts an example of a self-powered power sensor (SPPS) 100 according to a first configuration. The SPPS 100 includes of a current transformer (CT) 103 having its primary winding accepting a primary current 102. It further includes an analog-to-digital converter (ADC or A/D) 105 that converts the analog signal 104 into a series of digital samples 106 under the control of a clock or timer 113 and a microcontroller (MC) 107. The samples 106 gathered by the ADC 105 are processed by the MC 107 and then, using the transceiver 109, the processed information is transmitted 117 using the antenna 116. The transceiver 109 provides for two-way transmission and therefore a wireless signal 118 may be received using the antenna 116. A received signal 118 is provided by the transceiver 109 to the MC 107. As will be further discussed below, this enables two-way communication with a central controller, e.g., a bridge. According to this configuration, the transceiver 109, e.g., a radio frequency (RF) transceiver, may include a receiver portion to support features such as, and without limitation, sensing a carrier signal, clock synchronization, acknowledgement, firmware download, and configuration download. In a configuration, the transceiver is an unlicensed industrial scientific medical (ISM) band transceiver, operative, for example and without limitation, on the 2.4 GHz or sub GHz bands.

An oscillator 110 oscillates at a desired frequency and feeds to the clock or timer 113. U.S. Pat. No. 9,134,348 titled "Distributed Electricity Metering System," which is assigned to common assignee, describes in further detail such an exemplary SPPS. The power sensed therefrom is used for three purposes: to provide the power needed for the operation of the SPPS 100; to sense the actual power consumption of the load connected to the power line 102; and to detect and time stamp the phase of the current signal.

In one configuration, some form of spread-spectrum modulation technique may be used, for example and without limitation, direct sequence spread spectrum (DSSS), to enable better coexistence with other systems working in the same environment. The communication rate should be high enough to enable coexistence of a couple of hundred SPPSs in the same electrical closet. The power consumption of the RF transceiver 109 should be low enough to adhere with energy harvesting limitations which may be used by an SPPS. Yet another requirement of the RF transceiver 109 is to support a communication range sufficient to operate in an electrical closet, e.g., 3-4 meters metallic reach environment. In another configuration, the range may reach up to a few tens of meters in an indoor environment. This enables the placing of SPPSs on individual devices, e.g., on machines in a production line of a factory, and a minimum number of bridge units in the area. The RF transceiver 109 may use a standard PHY layer supporting, for example and without limitations, IEEE 802.15.4, and/or communication protocol, for example and without limitation, ZigBee. Use of such standards enables easy integration with existing systems that already include wireless hardware, such as smart meters.

Without interruption of the SPPS 100 clock or timer 113 operation, so as to avoid losing synchronization to the time-stamped samples and estimated zero-crossing time $T_1$, the SPPS 100 may receive wireless messages 118 from a central controller discussed in more detail herein. According to one configuration, one type of message received by the SPPS 100 may be a SYNC message further described in more detailed with respect of FIG. 4A. The SYNC message may include a single packet of data that contains various types of information and includes a central controller unique identification (UID). This UID enables an SPPS 100 to positively associate data previously received from the same central controller. The received message may include different fields of information, which will be further explained when describing FIG. 4A.

According to a configuration, the message sent as a packet over the received signal 118 may include various information transmitted from the central controller, such as the central controller type, control information, ambient temperature, voltage signal characteristics, and other system parameters. Such parameters may be saved in either integrated or electrically connected memory (not shown) of the MC 107. A cyclic redundancy code (CRC) calculation, forward error correction (FEC), or data redundancy may be further added to a packet for data validation at the transceiver 109 side.

One field of the message received over the wireless signal 118 may be a SYNC field, which is typically transmitted following the message preamble. The SYNC field is used to align the receiver to the frame itself (i.e., to the start of the message payload). The SYNC field has preferably good autocorrelation properties in order to allow accurate frame synchronization of the receiver even in the presence of bit errors caused by a wireless link. According to one configuration, the transceiver 109 may discard the received message if more than a certain amount of errors is detected (e.g., 2 out of 16 bits). The SYNC field allows an accurate time-stamping 115 by the clock or timer 113 of the message reception time ($T_4$). The SYNC message transmitted by a central controller may be received by an SPPS 100 located at a communication distance from the central controller. According to one configuration, but not by way of limitation, the communication distance may vary between several to tens of meters. The propagation delay caused by the wireless link is typically less than 0.2 µSec which may be determined to be insignificant with respect of the phase delay accuracy required for the power factor calculation.

Figure 4A:
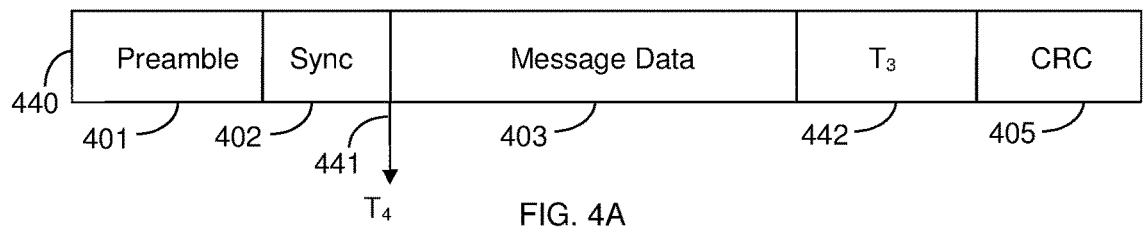
FIG. 4A is a message timing diagram and a message structure transferred from a central controller to an SPPS from a central controller perspective.

As noted above, when the SPPS 100 receives the message, it may time-stamp the reception of the SYNC field (denoted as $T_4$ in FIG. 4A). Following the reception of the SYNC field by the SPPS 100, the message data and $T_3$ field are received. $T_3$ is the time-stamp of the SYNC field transmission as measured by the central controller and transmitted by the transceiver. Assuming the message was received without errors, which may be checked using the CRC, the SPPS 100 has now the $T_4$ time stamp and the value of $T_3$ retrieved from the received message.

According to one configuration, the SPPS 100 can now calculate the difference $T_{offset}$ between the central controller time base and the SPPS 100 time base, i.e., the difference between the clock or timers of both units, at time $T_4$. The calculation is as follows:

$$T_{offset} = T_3 - (T_4 - T_{SBD} - T_{TD} - T_{RD})$$

where $T_{offset}$ is the difference between the clock or timers of the SPPS 100 and central controller at $T_4$ time. This difference may be positive or negative; $T_4$ is the time-stamp of the received SYNC field at the SPPS 100; $T_3$ Is the time-stamp of the transmitted SYNC field at the central controller; $T_{SBD}$ is the propagation time of the wireless message; $T_{TD}$ is the delay of a transmitter, i.e., the time delay introduced by the central controller transmitter portion of the transceiver before the signal is actually transmitted through its antenna; and, $T_{RD}$ is the delay of receiver, i.e., the time delay introduced by the SPPS receiver portion of the transceiver 109 after the signal was actually received by its antenna 116.

It should be noted that the $T_{TD}$ time delay is the difference between the time-stamp of the SYNC field and the time when the SYNC field has been transmitted through the central controller antenna. This delay depends on the transmitter implementation and the logic used to generate a pulse at the end of the SYNC field transmission. In one configuration, this delay may be in the order of 10-20 µSec and it cannot be ignored. However, it is quite constant and can be accurately measured. According to one configuration, the delay of the SPPS transmitter ($T_{TD}$) is calculated or measured and transmitted to a central controller in the transmitted message. It should be further noted that $T_{RD}$ time delay is the difference between the time stamp $T_4$ 441 of the SYNC field and the time when the SYNC field has been received through the SPPS antenna 116. Similar to $T_{TD}$, this delay depends on the receiver implementation and the logic used to generate a pulse at the end of the SYNC field reception. In one configuration, this delay may be in the order of 10-20 µSec and it cannot be ignored. However, it is also quite constant and can be accurately measured. According to one configuration, the delay of the SPPS receiver ($T_{RD}$) may be programmed into the SPPS 100 during the manufacturing process. Ignoring $T_{SBD}$, which may be insignificant, the SPPS 100 can accurately calculate the difference between the clock or timers of the SPPS 100 and central controller at $T_4$. Moreover, since the SPPS 100 and central controller have different clocks, which are also unsynchronized, it is expected that the time difference $T_{offset}$ at $T_4$ will not remain fixed over time.

Assuming a 20 parts-per-million (ppm) clock drift between the SPPS 100 and the central controller, one second after $T_4$, the value of $T_{offset}$ may increase or decrease depending on the actual clocks of the SPPS 100 and central controller, by 20 µSec. This is a significant error when measuring a power factor and therefore it should not be ignored. It is possible to reduce this error by using one or more of the following methods: reduce the clock drift by selecting a more accurate and stable oscillator 110 for the SPPS 100 and oscillator of the central controller; measure and calibrate the central controller's oscillator during manufacturing and transfer this information to the SPPS 100; and, measure by the SPPS 100 the clock drift by estimating the difference in the radio frequency (RF) carriers of the SPPS 100 and central controller. It should be noted that the RF synthesizer and time base of the central controller 500 may be driven from the same oscillator.

According to a configuration, the SPPS 100 periodically receives SYNC messages from a central controller. For example, and not by way of limitation, the interval between the SYNC messages may be between 100 msec to a few seconds in accordance to the accuracy desired and the stability of the clocks in both the SPPS 100 and central controller. Thus, having a periodic update, for example but not by way of limitation, every 200 msec of the $T_{offset}$ allows the SPPS 100 to maintain an accurate tracking of the central controller time base.

There are several possible methods to maintain the tracking of the central controller time base: update the value of $T_{offset}$ after the reception of the SYNC message, which is a simple method that does not require from the SPPS 100 to perform any further processing but can be less accurate than other methods. For example, assuming a clock drift of 20 ppm and a SYNC message interval of 200 msec, an average error of 2 µSec, with 4 µSec being the maximum error, is expected; estimate the value of $T_{offset}$ at any time by building a tracking filter, such as but not limited to, a Kalman filter, that is periodically updated by the values of $T_{offset}$ after each SYNC message reception. The latter method allows prediction of the value of $T_{offset}$ at any time, including after reception of a SYNC message. According to a configuration, the time base tracking may be implemented by software, firmware, hardware or any combination thereof, where the software and firmware execute on appropriately designed hardware.

According to one configuration, the input current signal 102 of the power line is transformed by a current transformer 103 to an analog signal 104 which can be sampled by an analog-to-digital converter (ADC) 105 connected to a microcontroller 107. The ADC 105 samples the input signal 104 using a sampling clock 112 which can be provided by a clock or timer 113. For example, this sampling clock 112 can be 3,200 Hz when sampling 50 Hz signals. In one configuration, the clock or timer 113 is driven from a clock 111 generated by an oscillator 110. The samples 106 may be stored in a memory (not shown) of a MC 107 for further processing. In a configuration, MC 107 is in standby mode when triggered 114 by the clock or timer 113 to exit standby mode and enter an operational mode causing it to start processing. This trigger 114 may be an interrupt signal provided by the clock or timer 113. When the MC 107 wakes-up, it may program the clock or timer 113 and the ADC 105 to start sampling the signal 104. The number of samples may be around half a cycle of a signal; e.g., 32 samples taken when sampling a 50 Hz signal with a 3,200 Hz sampling clock. Once the samples 106 have been stored in memory, which may be an internal memory of the MC 107 or a memory attached thereto (not shown), the MC 107 can process the samples to roughly estimate the start of a cycle ($T_s$) of the input signal 104. According to one configuration, the sampling of the input current signal 104 is programmed to be close to the reception of a SYNC message, thus reducing the error caused by the clock drift.

Once the start of the cycle ($T_s$) has been estimated, the MC 107 can program the clock or timer 113 to force the ADC 105 to start a new burst of samples at $T_s$. Since the start of the sampling is triggered by the clock or timer 113, and not by a software command from the MC 107, the time-stamp of all the samples can be accurately recorded. According to a configuration, the MC 107 may estimate the time of the zero-crossing point ($T_1$) of the sampled signal 106. This may be the 0° or 180° zero-crossing. Other configurations may include estimating the peak (positive or negative) of the signal. In a configuration, the zero-crossing point ($T_1$) estimation may be done by linear interpolation or extrapolation, or may include more sophisticated and accurate methods like, but not limited to, non-linear regression or similar methods. In certain configurations, estimating the zero-crossing point with an accuracy of ±0.5° may be sufficient for estimating the power factor while other configurations may require different levels of accuracy.

Since the SPPS 100 may maintain time tracking and synchronization to a corresponding central controller time base, the MC 107 can calculate the time-stamp of $T_1$ but in accordance to the central controller counter or timer. Hereinafter this timestamp is donated as $T_{1mu}$. $T_{1mu}$ may be calculated as follows:

$$T_{1mu} = T_1 + T_{offset-T1}$$

where $T_{1mu}$ is $T_1$ time-stamp according to the central controller, that is $T_1$ as it would be time stamped by the central controller; $T_1$ is the $T_1$ time-stamp as estimated by the SPPS 100, that is according to the SPSS 100 clock or timer 113; and, $T_{offset-T1}$ is the value of $T_{offset}$ at $T_1$ time that may be the value of the value of $T_{offset}$ received closest to $T_1$, or more accurate values estimated using methods as interpolation, Kalman filters, and the like.

Upon determination that a transmission is to take place, the MC 107 prepares a message 108 to be transmitted. The message 108 is typically a single packet of data that may contain various types of information and include the SPPS's unique identification (UID) which enables a central controller to positively associate the current data received with previous data handled by the central controller with respect of the SPPS 100. The transmitted message 108 may include different fields of information, which will be further explained when describing FIG. 4B. One of those message fields is the value of $T_{1mu}$. The message 108 packet may include, without limitations, various SPPS status information, hardware version, software version, alerts such as overload, average current, SPPS temperature, time-stamped samples, input signal characteristics, power off indication, e.g., upon identification that the load was turned off, and other system parameters, further discussed below. Such parameters may be saved until such time of transmission in the MC 107 memory (not shown). A cyclic redundancy code (CRC) calculation, forward error correction (FEC), or data redundancy may be further added to a packet for data validation at the receiver side.

As previously described, the input signal 104 may be a superposition of the fundamental frequency (for example 50 Hz) and higher order harmonics or noise. This is typical when sampling power lines connected to non-linear loads, for example those including on/off operations. In such cases, the current signal is distorted, and hence the timing of the zero-crossing does not necessarily represent the phase shift from the voltage. Moreover, in highly distorted loads with a large content of high order harmonics one may encounter several zero-crossings within a single cycle. The zero-crossing point ($T_1$) relevant for the power factor calculation (as will be further on explained) must be the one of the fundamental component of frequency of the signal (for example 50 Hz) and not of the distorted signal that is a superposition of the fundamental frequency and higher order harmonics In such a configuration, estimating the zero-crossing point ($T_1$) of the sampled signal 106 may require a previous filtering of the input or sampled signal to allow estimating the zero-crossing point on the fundamental component of the input signal.

According to one configuration, filtering the input signal 104 may be performed by a digital filter implemented by the MC 107. In such a configuration, the MC 107 may use the signal samples to generate a new set of samples of a filtered signal. For example, a third-order low pass filter with an attenuation of 20-40 dB of the third harmonic (i.e., 150 Hz harmonic for a 50 Hz input signal) may suffice for typical third harmonic distortions. Other configurations may include different types of digital filters with a higher order.

The settling time of the digital filter may require using more than half a cycle as previously described. In some circumstances, it may be determined as necessary to store 5 or 10 cycles, so as to let the digital filter settle and provide an accurate output. In addition, as previously described, 32 samples per half cycle may not be sufficient for the same reason. In certain configurations it may be necessary to store 80-120 samples or more per half cycle.

According to one configuration, the MC 107 may also estimate the RMS value of the input signal 102 and the RMS value of the filtered signal (i.e., the fundamental component). Those values may be calculated using the respective signal samples and the filtered samples. This is needed so as to further calculate more accurately the power factor according to the following approximation:

$$PF = \frac{Vf[\text{RMS}]}{Vs[\text{RMS}]} * \frac{If[\text{RMS}]}{Is[\text{RMS}]} * \cos(\phi)$$

where $I_s$ [RMS] is the RMS value of the input (non-filtered) signal; $I_f$ [RMS] is the RMS value of the fundamental component of the input signal; $V_s$ [RMS] is the RMS value of the voltage; $V_f$ [RMS] is the RMS value of the fundamental component of the voltage; cos ($\phi$) is the displacement power factor, or the power factor of the fundamental signal; and PF is the true power factor When using a filter to attenuate the harmonics and the noise, it is necessary to take into account the phase delay introduced by the filter itself. This is important to allow estimating the true zero-crossing time. This will be further discussed. According to one configuration, $V_s$ and $V_f$ may be estimated by the central controller. However, in another configuration, as voltage is kept relatively constant and un-distorted by the network provider, $V_s$ and $V_f$ may be ignored and $V_f/V_s$ can be assumed to be equal to 1.

In one configuration, when certain conditions to transmit are met, the MC 107 can implement a carrier sense multiple access (CSMA) mechanism for the purpose of collision avoidance. The following steps may therefore be taken: first, the receiver of the RF transceiver 109 is switched on; second the receiver senses whether there are currently other transmissions. This is particularly important in the environment in which the SPPS operates, which may be an environment rich with SPPSs, possibly a few hundreds of them. Third, upon determination that the air is free, the receiver is disabled and the transmitter of the RF transceiver 109 is enabled for transmission to send the information message 108; otherwise, the receiver is disabled and the MC 107 selects a random time interval, after which the MC 107 attempts to start a new transmission, until the desired transmission is completed.

In one configuration, the information messages are short enough and the intervals between transmissions are long enough such that collisions are highly unlikely. In such a configuration, the transmission of the transmitted message 117 may take place without pre-sensing of the air, thereby conserving energy. In a configuration, the transmitted message may include $T_{1mu}$, which allows the central controller to know the time of the input current 104 zero-crossing according to its own time base, i.e., the central controller time base. In a configuration, the transmitted message may further include information to let the central controller receiving the message, for example central controller 500 described in greater detail with respect of FIG. 5, fully calculate the power factor, including the zero-crossing of the primary input current signal (i.e., the current signal through the power line, which is the primary winding of the current transformer 103). This information may include values of $I_s$ [RMS] and $I_f$ [RMS], and the time delay of the CT 103 ($T_{CTD}$), which is the time delay of the SPPS's 100 current transformer 103 (i.e., the time difference between the primary current 102 and the signal 104 fed to the ADC 105). It should be recognized that a CT-based sensor may also cause a phase shift that may impact the accuracy of the measurements. In some cases, this phase delay may be significant and should not be ignored if an accurate power factor calculation is required. The CT 103 phase delay is not constant and is affected by several factors, including input current 102 amplitude (RMS); type of current transformer; current transformer temperature; input signal 102 frequency; and the air gap of the current transformer (in the case of a split core CT). Therefore, a phase calibration factor value may be transmitted in the message sent from the SPPS 100 to the central controller. Such a calibration factor may be embedded as part of the code or configuration parameters of the MC 107 during manufacturing, or, if the SPPS 100 is susceptible to parameter changes, for example over time or over a temperature range, by periodically performing a self-determination of the calibration factor necessary due to the current characteristics of the SPPS 100. The calibration factor can be a linear or a higher degree function of the input current, expressed in a formula or lookup table. This is specifically relevant for nonlinear CTs. In another case, the phase calibration factor may be known to the central controller. Regardless of the way such a calibration factor is provided, the factor may be used for the purpose of correcting the power factor or signal timing on a per SPPS 100 basis. It should be noted that a single calibration factor for all of the SPPS 100 is also possible without departing from the scope of the present disclosure. According to one configuration, the estimated CT 103 delay ($T_{CTD}$) is then transmitted to the central controller in the transmitted message.

The information included in the transmission further includes the delay of filter ($T_{FD}$) value, which is the time delay of the filter (e.g., a low pass filter) used to attenuate the input signal distortion caused by harmonics and noise. $T_{FD}$ refers to the phase delay of the fundamental component of the input signal. According to one configuration, the $T_{FD}$ is calculated or measured and transmitted to a central controller as part of the transmitted message. When digital filters are used, the delay of this filter is a function of the filter type but does not change among different SPPS units or with the amplitude of the input current. According to another configuration, the calculated $T_{1mu}$ further includes the time delays caused by some of the SPPS 100 functions as described herein. In this case $T_{1mu}$ is the time-stamp, according to the central controller time base, of the zero-crossing of the input current signal 102.

Figure 2:
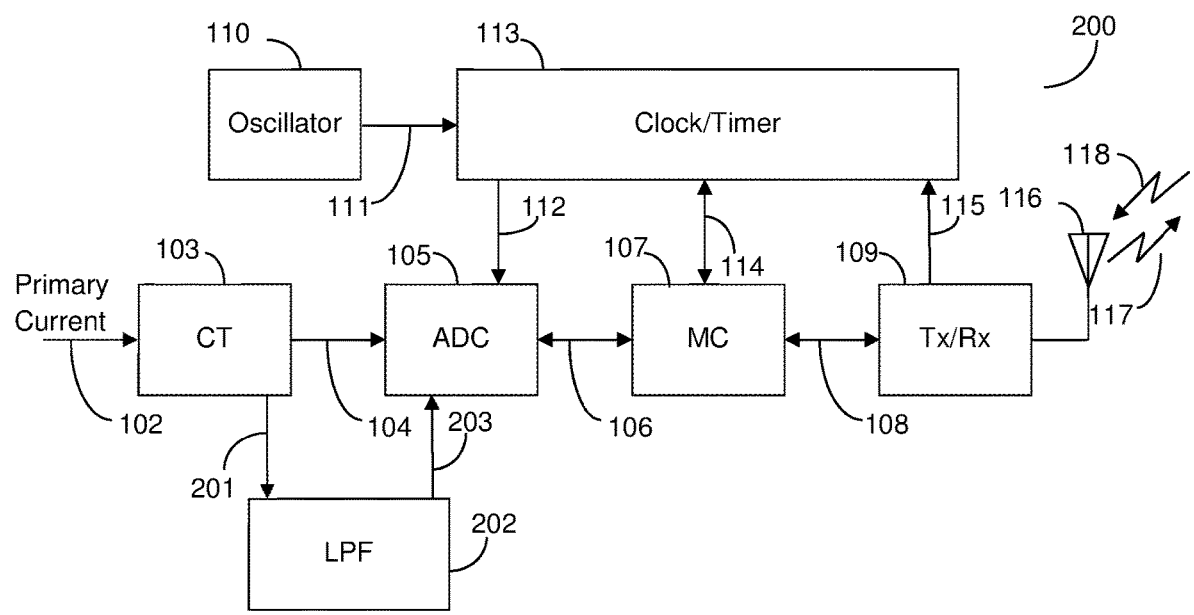
FIG. 2 is a second exemplary SPPS (prior art).

FIG. 2 shows an additional SPPS 200 that includes the same basic elements as described for SPPS 100 depicted in FIG. 1, and further includes a low pass filter 202 connected to the current transformer 103 and ADC 105. In one configuration, the low pass filter 202 is an analog filter. The input 201 may be derived from the current transformer 103. The analog filter may be implemented in various ways, including passive or active filters, matched filters, harmonic filters, and the like. According to the configuration as shown in FIG. 2, the filtered signal 203 is fed to the ADC 105. Thus, the MC 107 can select which signal shall be sampled (i.e., the input signal 104 or the filtered signal 203). In other configurations, the ADC 105 includes two channels and both signals can be sampled simultaneously. According to a further configuration, the low pass filter 202 can be activated only when sampling of the fundamental signal 203 is required, thus saving power consumption.

Figure 3:
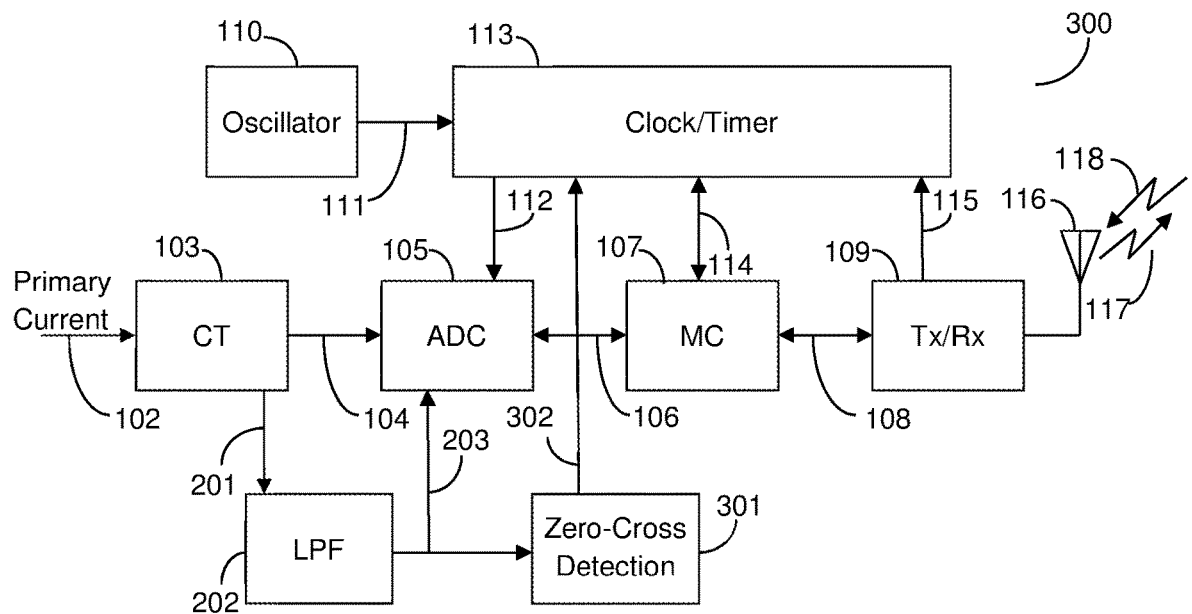
FIG. 3 is a third exemplary SPPS (prior art).

FIG. 3 shows yet an additional SPPS 300 that includes the same basic elements as described for SPPS 200 depicted in FIG. 2, and further includes a zero-crossing detector circuit 301 coupled to the low pass filter 202 and the clock or timer 113. In one configuration, the low pass filter 202 is an analog filter. The input 201 may be derived from the current transformer 103. The analog filter may be implemented in various ways, including passive or active filters, matched filters, harmonic filters, and the like. According to one configuration as shown in FIG. 3, the filtered signal 203 is fed to a zero-crossing detection circuit 301 which generates a signal 302 relative to the zero-crossing time of the filtered signal 203. According to this configuration, the generated signal 302 may be time-stamped by the clock or timer 113. Thus, the MC 107 can use the time stamp of zero-crossing ($T_1$) to report it to a central controller as previously described. This reporting may replace the estimation the zero-crossing of the signal using time-stamped samples as described in FIGS. 1 and 2. According to one configuration, the zero-crossing detection circuit 301 may include a comparator, preferably with a small aperture to avoid significant errors in the zero-crossing detection.

Figure 4B:
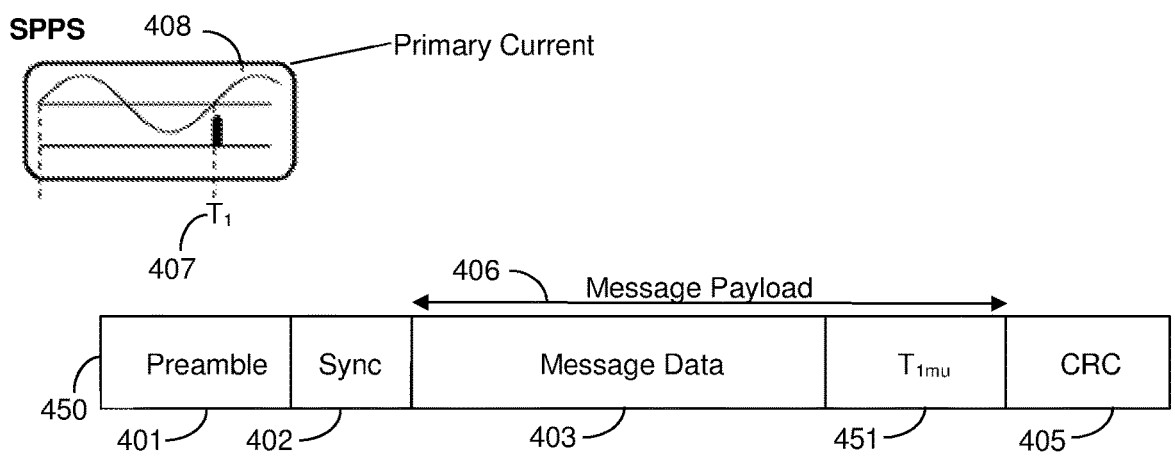
FIG. 4B is a message timing diagram and message structure transferred from an SPPS to a central controller from an SPPS perspective.

FIG. 4A is a message timing diagram and message structure transferred from a central controller to an SPPS 100 from the perspective of a central controller 500, according to an embodiment. FIG. 4B is a message timing diagram and message structure transferred from a SPPS 100 to a central controller 500 from the perspective of an SPPS 100, according to an embodiment. According to an embodiment, a central controller 500 periodically transmits SYNC messages 440 which are received by one or more SPPS 100 units that are within a communication range. The message payload 406 includes message data 403, e.g., central controller type, control information, ambient temperature, voltage signal characteristics and other system parameters, and a time-stamp $T_3$, which is the time-stamp of the transmitted SYNC field 402 of the central controller 500.

The MC 107 of the SPPS 100 has the zero-crossing time stamp $T_1$ 407 of the input signal 408 or of the fundamental component of the input signal 408 if a low pass filter is implemented according to the embodiments described above. The zero-crossing time $T_1$ 407 may be estimated within the MC 107 from time-stamped samples according to the various methods described herein above or received from another dedicated circuit. In another embodiment the comparator used to implement a zero-crossing detector may be a function of the MC 107 itself or implemented by the MC 107. The SPPS 100 may be configured to continuously track the central controller 500 time base as explained herein without interrupting the time counting of the clock or timer 113. The MC 107 in the SPPS 100 may start transmitting a wireless message 450 to a central controller 500 which may be, for example but without limitation, a bridge.

According to one embodiment, the transmitted message 450 includes a preamble 401, typically used by the receiver to detect the incoming signal and, if necessary, align some of its parameters (e.g., gain, receive clock frequency and phase, etc.). Following the preamble 401, a SYNC field 402 may be transmitted. The transmitted message payload 406 follows, and may include message data 403, including SPPS identification, status of the SPPS, RMS values of the input current and filtered current signals, $T_{1mu}$ 451, and any other information required by the system. The message 450 transmission is completed by transmitting a CRC field 405 which is used by the receiver to detect errors in the message payload 406 or CRC 405. The transmitted message 440 may be received by a central controller 500 located at a wireless communication distance from SPPS 100. According to one embodiment, the communication distance may vary between a few to tens of meters.

Following the SYNC field 402 reception by the central controller 500, the message data 403 and $T_{1mu}$ 451 fields are received. Assuming the message was received without errors (e.g., as checked using the CRC 405), the central controller 500 retrieves the $T_{1mu}$ 451 time-stamp from the received message. The central controller 500 may now calculate the time stamp of the zero-crossing of the primary current signal 102 in the SPPS 100 in accordance with the central controller 500 time base. The calculation is as follows:

$$T_{PZC}=T_{1mu}+T_{cycle}-T_{CTD}-T_{FD}$$

where $T_{PZC}$ is the zero-crossing time stamp of the primary input signal 102 in the SPPS 100 according to the central controller 500 time base (timer); $T_{1mu}$ is the $T_1$ time stamp according to the central controller 500, i.e., $T_1$ time as it would be time stamped by the central controller 500; $T_{cycle}$ is the cycle time of the input signal (e.g., 20 msec for a 50 Hz signal); $T_{CTD}$ is the time delay of the current transformer; and $T_{FD}$ is the time delay of the SPPS filter, if used. The time of the zero-crossing of the current input signal in the central controller 500 is necessary to calculate the time difference to the voltage signal zero-crossing and calculate $\cos(\phi)$. It should be noted that wherever technically appropriate, SPPS 200 or SPPS 300 may replace SPPS 100 described herein, and the use of SPPS 100 is for convenience of description and not intended to limit the scope of the disclosure.

Figure 5:
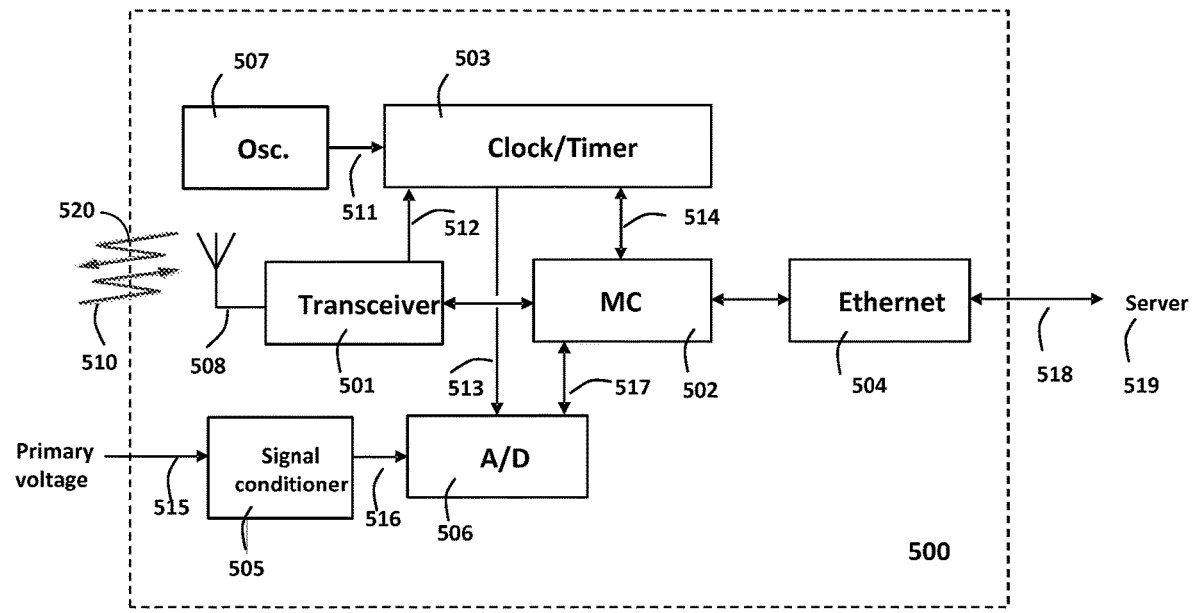
FIG. 5 is a block diagram of a central controller according to an embodiment.

FIG. 5 is a block diagram of a central controller 500 according to an embodiment. The central controller 500, which may be a bridge, contains an analog section that is coupled to a microcontroller 502. The analog section includes a signal conditioner 505 configured to adapt the voltage signal from the power line 515 to a signal suitable to be sampled by an analog-to-digital converter (ADC) 506. The signal conditioner 505 may also include a protection circuit (not shown) to protect the bridge from disturbances in the voltage line. According to one embodiment, the primary voltage signal 515 is adapted by the signal conditioner 505 to a conditioned signal 516. The ADC 506 can sample the conditioned signal 516 with a sampling clock 513, which can be provided by a clock or timer 503. For example, this sampling clock 513 can be 3,200 Hz when sampling 50 Hz signals. In one embodiment, the clock or timer 503 is driven from a clock 511 provided by an oscillator 507. The samples 517 can be stored in the MC 502 of the central controller 500 or memory attached thereto (not shown) for further processing. In one embodiment, the MC 502 is configured to periodically program and activate the clock or timer 503 to trigger and provide the clock 513 for the sampling of the conditioned signal 516 by the analog-to-digital converter 506.

The number of samples may include a full cycle of the signal 516 (e.g., 64 samples when sampling a 50 Hz signal with a 3,200 Hz sampling clock). Once the samples 517 have been stored, e.g., in the MC 502 or the attached memory (not shown), the MC 502 can process the samples to accurately determine the zero-crossing of the conditioned voltage signal 516. Since the start of the sampling is triggered by the clock or timer function 513 and not by a software command from the MC 502, the time-stamp of all the samples can be accurately determined and recorded.

According to one embodiment, the MC 502 may estimate the time of the zero-crossing point ($T_{VZC}$ which may also be referred to as $T_4$) of the sampled signal 516. This may be the 0° or 180° zero-crossing. Other embodiments of the present disclosure may include estimating the peak (positive or negative) of the signal. However, due to the low derivative of sinusoidal signals around the peak, such estimates may be less accurate. In one embodiment, the $T_{VZC}$ estimation may be done by linear interpolation or extrapolation, or may include more sophisticated and accurate methods, such as non-linear regression or similar methods. Some methods as described above for the zero-crossing estimation for the current samples may apply here as well. In certain embodiments, estimating the zero-crossing point with an accuracy of ±0.5° may be sufficient for estimating the power factor, while other embodiments may require different levels of accuracy. Keeping the clock or timer operation 503 continuously running (i.e., to avoid losing synchronization to the time-stamped samples), the central controller 500 may start periodically transmitting wireless messages 520 to a SPPS unit. For that purpose, a RF transceiver 501 is connected to the MC 502 and to an antenna 508 to provide for one or two-way communication with an SPPS unit.

In one embodiment, the RF transceiver 501 includes a receiver portion to receive SPPS messages and a transmitter portion to support features such as clock synchronization with an SPPS, acknowledgement, firmware download, and configuration download. The transceiver may be an unlicensed industrial scientific medical (ISM) band transceiver, operative, for example and without limitation, on the 2.4 GHz or Sub GHz frequencies.

In one embodiment, some form of spread-spectrum modulation technique may be used, for example and without limitation, direct sequence spread spectrum (DSSS), to enable better coexistence with other systems working in the same environment. The communication rate should be high enough to enable coexistence of a couple of hundred SPPSs in the same electrical closet. The power consumption of the RF transceiver 501 should be low enough to adhere to energy harvesting limitations which may be used by an SPPS. Yet another requirement of the RF transceiver 501 is to support a communication range sufficient to operate in an electrical closet, e.g., 3-4 meters metallic reach environment. In another embodiment, the range may reach up to a few tens of meters in an indoor environment. This enables the placing of SPPSs on individual devices, e.g., on machines in a production line of a factory, with a minimum number of bridge units in the area. The RF transceiver 501 may use a standard PHY layer supporting, for example and without limitations, IEEE 802.15.4, and/or a communication protocol, for example and without limitation, ZigBee. Use of such standards enables easy integration with existing systems that already include wireless hardware, such as smart meters.

According to one embodiment, when the central controller (e.g., a bridge) 500 starts transmitting a SYNC message to an SPPS 100, a logic in the transmitter detects the transmission of the SYNC field 402 and generates a pulse 512 which may be time stamped by the clock or timer 503. This time stamp is denoted $T_3$. Keeping the clock or timer 503 continuously running, the time-stamp $T_3$, denoting the SYNC field 402 transmission, is inserted into the transmitted message, i.e., into field 443. The central controller 500 may also receive wireless messages 510 from one or more SPPS 100 units. Such a message may include information to allow the central controller 500 to calculate the time-stamp of the input current zero-crossing $T_{Pzc}$ as described herein.

Having the $T_{Pzc}$ and $T_{VZC}$ time stamps, the central controller 500 can calculate the time delay between the current and voltage signals as follows:

$$T_{VID} = T_{VZC} + T_{cycle} - T_{Pzc}$$

where $T_{VID}$ is the time difference between the zero-crossing time stamp of the input voltage signal and the primary input current signal 102 zero-crossing, where the time stamp is according to the central controller 500 time base (timer); $T_{VZC}$ is the zero-crossing time stamp of the input voltage signal 515 in the central controller 500; $T_{PZC}$ is the zero-crossing time stamp of the primary input signal 102 in the SPPS 100, where the time stamp is according to the central controller 500 time base (timer); and $T_{cycle}$ is the cycle time of the input signal (e.g., 20 msec for a 50 Hz signal). Since the time stamp of the input voltage $T_{VZC}$ may be performed by the central controller 500 (e.g., a bridge) after or before the calculated time stamp of the input current $T_{Pzc}$, the calculated value $T_{VID}$ may require an adjustment as follows (the delay cannot be more than +/−0.25*$T_{cycle}$): if $T_{VID}$<0, then add an integer number of quarter cycles (i.e., N*0.25*$T_{cycle}$, where N is an integer) until the number is positive and <0.25*$T_{cycle}$; if $T_{VID}$>0.25*$T_{cycle}$, then subtract an integer number of quarter cycles (i.e., N*0.25*$T_{cycle}$) until the number is positive and <0.25*$T_{cycle}$; and, if 0≤$T_{VID}$≤0.25*$T_{cycle}$, there is no need to adjust $T_{VID}$.

In one embodiment, the cycle time of the input voltage signal (i.e., the power line frequency) may be estimated based on the time stamped samples 517. Since the line frequency is not expected to change over short intervals, this estimation may be performed at intervals of a minute or more. In another embodiment, as the line frequency is kept relatively constant by the power provider (for example, at a 50 Hz grid the frequency may not change by more than 0.25 Hz—i.e., 0.5%) a constant value of $T_{cycle}$ can be used and stored in central controller 500 without measuring it periodically. In another embodiment, the central controller 500 may be periodically updated from a server though an Ethernet link 518, which can accurately measure the line frequency in a site and update all the central controllers 500 in the site. After the voltage-current delay has been calculated, the phase difference φ between the input voltage and the input current is calculated as follows:

$$\phi \text{ [degrees]} = 360 * (T_{VID}/T_{cycle})$$

$$\phi \text{ [radians]} = 2\pi * (T_{VID}/T_{cycle})$$

In an embodiment, the central controller 500 may also include a low pass filter, implemented as a digital filter in the MC or as an external filter (not shown), generating another signal (not shown) that contains only the fundamental frequency of the voltage. This signal will also be measured by the A/D and then the ratio Vf[RMS]/Vs can be calculated [RMS]. However, in some cases this stage is not necessary, assuming the input voltage distortion is relatively negligible. The power factor can then be calculated in the central controller 500 using the calculated cos φ as well as the other parameters of $V_s$[RMS], $I_s$[RMS], $V_f$[RMS], and $I_f$[RMS]. The power factor can then be used to calculate the power consumption of the load. The central controller 500 can handle simultaneous calculations of cos φ for multiple SPPS units. According to one embodiment, the calculated phase difference φ, the resulting cos φ, and/or the power factor may be sent by the central controller 500 to a management server 519. This information, along with other parameters from both the SPPS 100 and the central controller 500, such as (but not limited to) $V_s$[RMS], $I_s$[RMS], Vf[RMS], $I_f$[RMS] can be sent to the management server 519 using an Ethernet adapter 504 coupled to the MC 502. It should be notes that many other communication means may be used by the central controller to transfer this information to the server, including and without limitation, IEEE802.11/a/b/g/n/ac/ad networks, IEEE802.15.4, cellular 3G/4G/5G networks, USB, and the like.

Figure 6:
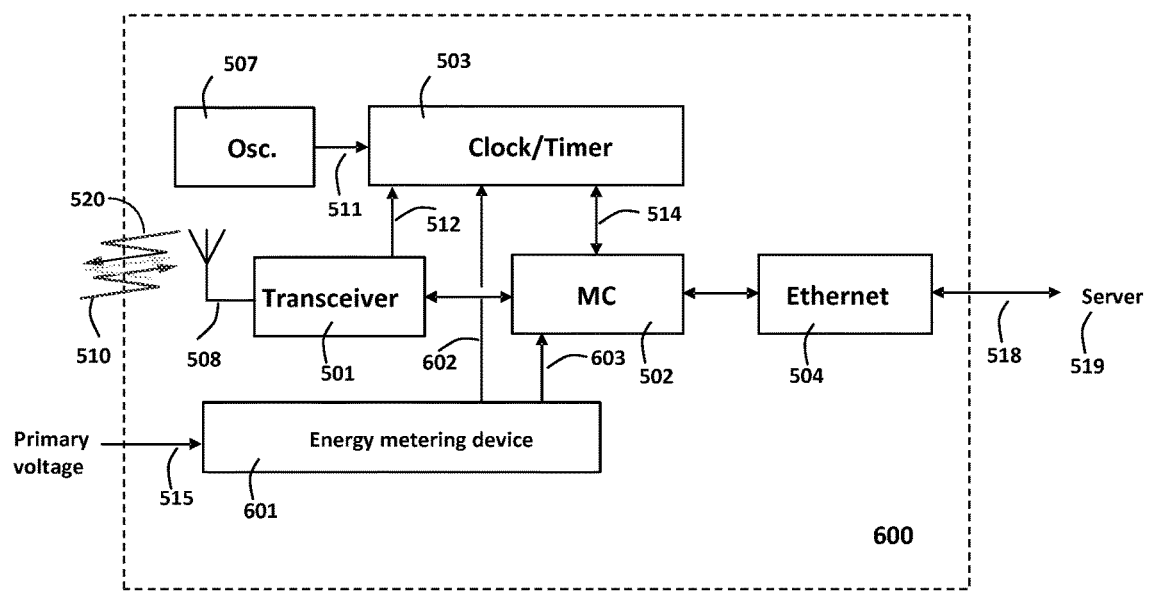
FIG. 6 is a block diagram of a central controller according to another embodiment.

FIG. 6, is a block diagram of a central controller 600 according to a further embodiment. The central controller 600, which may be embodied as a bridge, includes similar functions as described in FIG. 5, but differs in the way the zero-crossing of the input voltage 515 is detected. According to one embodiment, the communication bridge MC 502 is coupled to an energy metering device 601 which includes a circuit to detect the zero-crossing of the primary voltage signal 515. In such an embodiment, the energy metering device 601 generates a digital signal 602 which is directly related to the time of the zero-crossing. Depending on the selected metering device, the generated digital signal 602 may have a fixed delay ($T_{MD}$) in respect to the zero-crossing time. This delay $T_{MD}$ needs to be taken into account by the central controller 600 when calculating the overall time difference between the line voltage and line current. The above energy metering device may also measure $V_f$[RMS] and $V_s$[RMS], which may be used for the power factor calculation.

Figure 7:
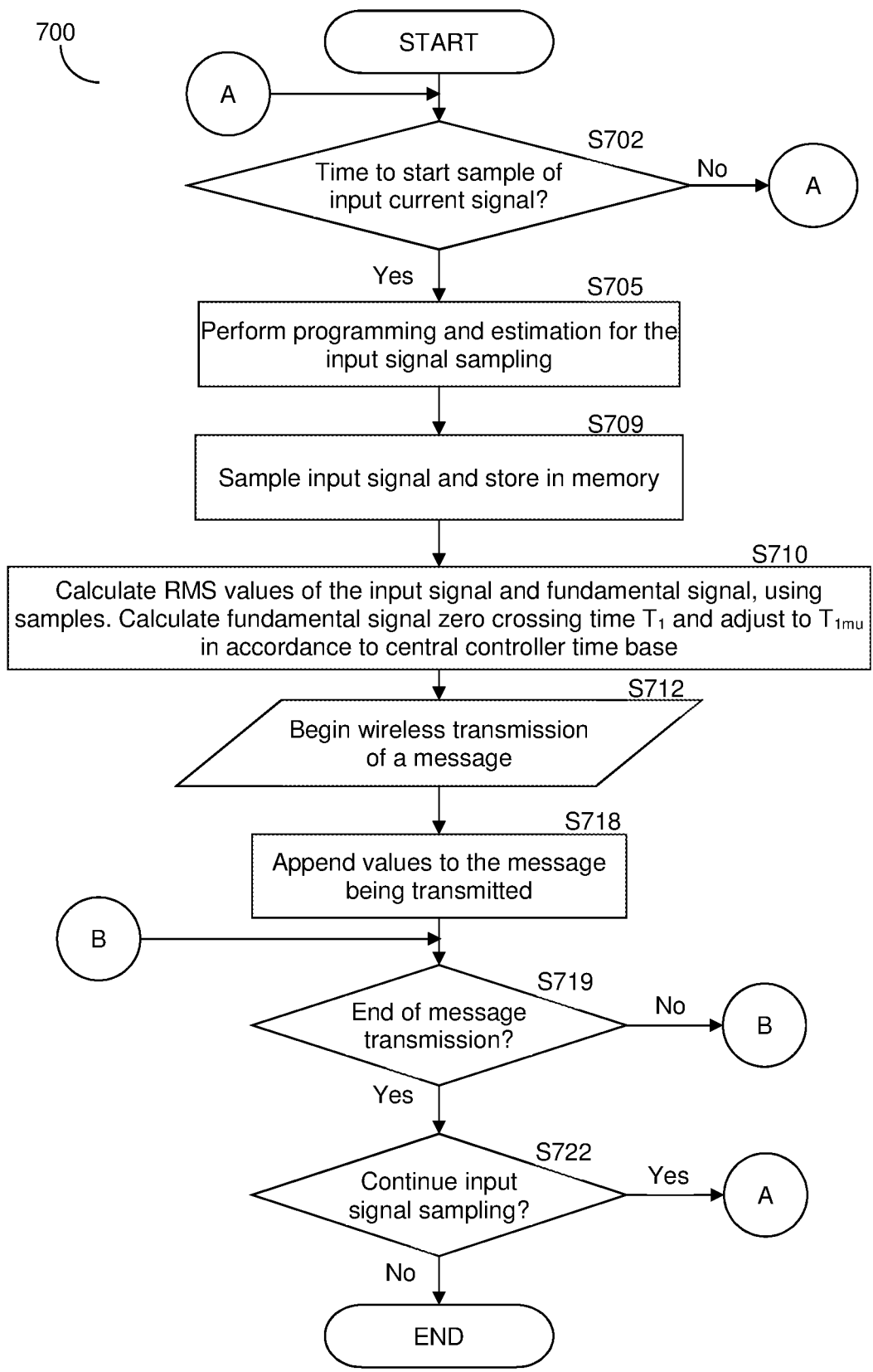
FIG. 7 is a flowchart of a method for an SPPS to calculate and report an RMS value according to an embodiment.
Figure 8:
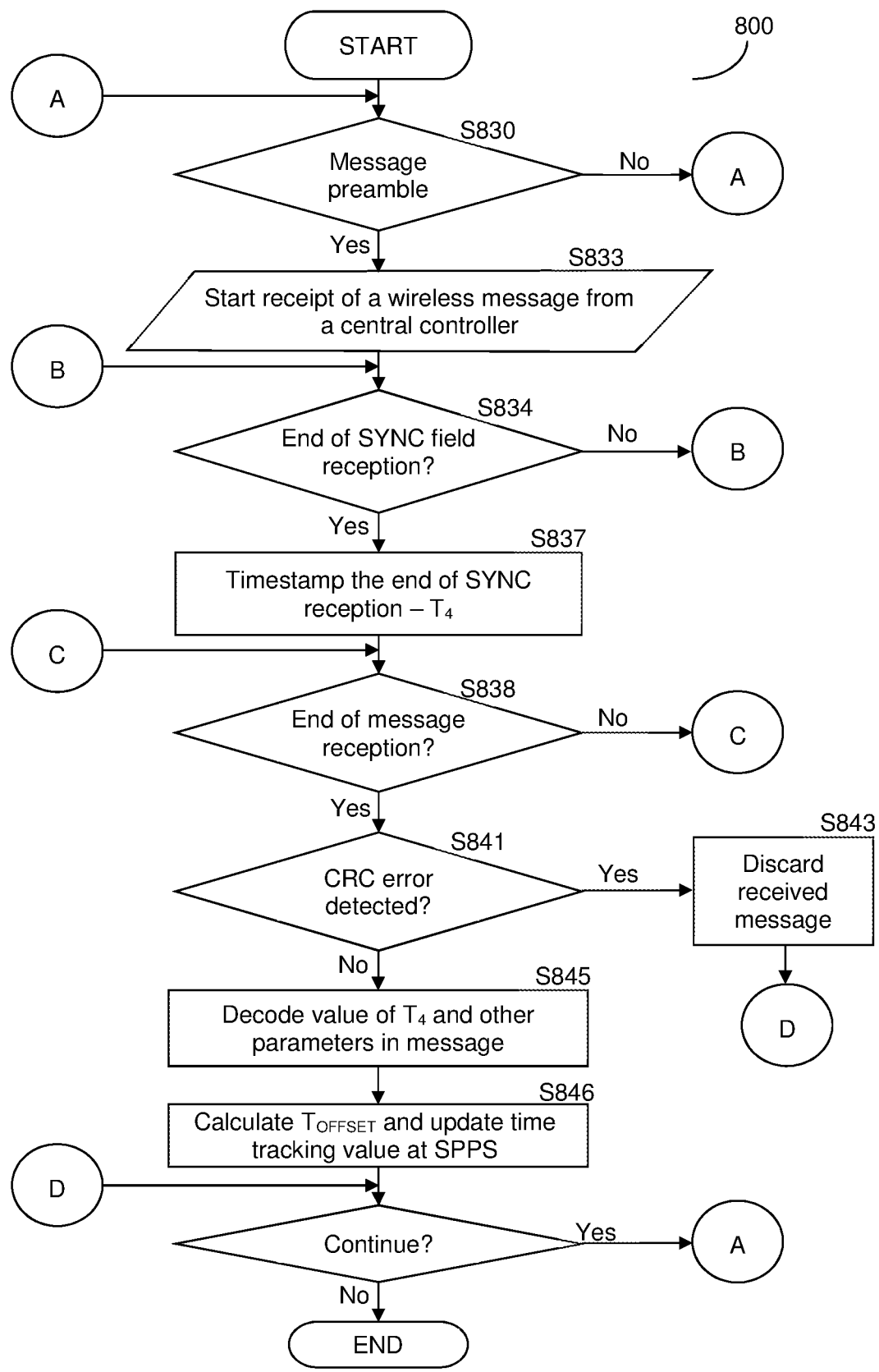
FIG. 8 is a flowchart of a method for an SPPS to synchronize times between a central controller and the SPPS according to an embodiment.

FIG. 7 is a flowchart of a method 700 to calculate and report an RMS value according to an embodiment. FIG. 8 is a flowchart of a method 800 to synchronize times between a central controller and an SPPS for accurate calculation of the RMS value according to an embodiment. As should be apparent to the skilled in the art and for the sake of clarity, the methods 700 and 800 only describe those elements that are needed to explain the methods while other elements are omitted merely for the sake of clarity. The two flowcharts are explained herein separately but it should be understood, as may be apparent to the skilled in the art, that in a real implementation, these two methods may be executed concurrently, e.g., by an operating system capable of management of several tasks.

At S702 it is determined if it is time to sample an input current signal. If so, at S705 the input current signal is sampled, e.g., via the MC 107 programing the clock or timer 113 and the ADC 105 to start sampling the input current signal 104.

At S709, the samples are stored in memory. In an embodiment, the samples are only stored after a predetermined number of samplings have occurred (e.g., 32 samples for a 50 Hz signal)

At S710, RMS values of the input signal and the fundamental signal are estimated. In an embodiment, the zero-crossing time $T_1$ of the fundamental component of the input signal 104 is estimated as well. The zero-crossing point ($T_1$) estimation may be done by linear interpolation or extrapolation or may include more sophisticated and accurate methods like non-linear regression or similar methods. For example, in a linear approximation, linear regression can be applied on the last two samples prior to the zero-crossing, represented by samples Sa and Sb and times Ta and Tb accordingly, to find the constants a and b of a linear equation S=a*T+b representing the part of the signal that is close to the zero-crossing. Applying S=0 will yield $T_1$ which is the zero-crossing point. In another embodiment, $T_1$ can be taken simply as the time of the first sample, where the sample value changes sign between positive and negative or vice versa, or the average of the times of the two samples in which the analog signal changes sign, although the latter two may be less accurate if the sampling rate is not high enough. In certain embodiments, estimating the zero-crossing point with an accuracy of ±0.5° may be good sufficient for estimating the power factor while other embodiments may require different levels of accuracy. In another embodiment, the zero-crossing evaluation may be done using continuous sampling of a few cycles of the signal without prior estimating the time of start of the signal or allowing the MC to enter into standby mode. The RMS value of the input signal 102 and the RMS value of a filtered signal (i.e., the fundamental component) may be calculated using the respective signal samples and the filtered samples. This is needed to calculate more accurately the power factor according to the following approximation:

$$PF = \frac{If[RMS]}{Is[RMS]} * \cos(\phi)$$

where: $I_s$ [RMS] is the RMS value of the input (non-filtered) signal; $I_f$ [RMS] is the RMS value of the fundamental component of the input signal; cos (φ) is the displacement power factor, or the power factor of the fundamental signal; and, PF is the true power factor.

In one embodiment, at S710 the $T_{1mu}$ time is calculated, which is the $T_1$ time stamp referenced to the central controller time base. This is the central controller synchronizing the SPPS. $T_{1mu}$ is calculated as follows:

$$T_{1mu} = T_1 + T_{offset-T1}$$

where $T_{1mu}$ is the $T_1$ time stamp in accordance to a central controller (e.g., $T_1$ time as it would be time stamped by the central controller 500); $T_1$ is the $T_1$ time stamp as estimated by the SPPS (e.g., in accordance with the SPSS 100 clock or timer 113); and $T_{offset-T1}$ is the value of $T_{offset}$ at $T_1$ time, which may be the value of $T_{offset}$ closest received to $T_1$ time, or more accurate values estimated using methods as interpolation, Kalman filters, and the like.

At S712, upon determination that a transmission is to take place, a message is transmitted, e.g., to the central controller.

The message 400 is typically a single packet of data that may contain various types of information and include the SPPS's unique identification (UID), which enables a central controller 500 to positively associate the current data received with previous data handled by the central controller with respect of the SPPS 100.

At S718, different fields of information are included in the message, e.g., the fields further explained in FIG. 4B. One of those message fields is the value of $T_{1mu}$. In addition, and without limitations, the message may include $I_f$ and $I_s$ of the input current signal, various SPPS status information, central controller type, alerts such as overload, average current, SPPS temperature, time-stamped samples, input signal characteristics, power off indication, e.g., upon identification that the load was turned off, and other system parameters.

At S719, it is determined if the entire message has been transmitted and when this happens, at S722 it is checked if there is need to continue signal sampling; if so, execution returns to S702 to wait for the start of a new measurement cycle; otherwise execution ends. According to the implementation, this may incur reprogramming of the clock or timer 113 as previously explained.

FIG. 8 is a flowchart of a method 800 of receiving a SYNC message from a central controller. At S830, it is determined if a message preamble has been detected. The message reception may be handled by a transceiver. Thus, when a message preamble is detected, at S833 the incoming message is received, e.g., by a wireless transceiver. At S834, it is determined if the end of the SYNC field has been received, and when it has, the end of the SYNC field reception is time stamped, e.g., by a clock or timer, at S837. This time stamp may be denoted as $T_4$.

At S838 is it determined if the message reception is complete, and at S841 it is determined if the message has been received successfully without uncorrectable errors (e.g., CRC errors). If the received message does contain uncorrectable errors, then it is discarded at S843 and execution continues with S848. If the received message has no errors, then the value of $T_4$ and other parameters are decoded at S845 from the received SYNC message. According to one embodiment, the difference $T_{offset}$ between the central controller time base and the SPPS time base (i.e. the difference between the clock or timers) at $T_4$ time is calculated at S846. The calculation is as follows:

$$T_{offset} = T_3 - (T_4 - T_{SBD} - T_{TD} - T_{RD})$$

where $T_{offset}$ is the difference between the clock or timers of the SPPS and central controller at $T_4$ time, where the difference may be positive or negative; $T_4$ is the time stamp of the received SYNC field at the SPPS; $T_3$ is the time stamp of the transmitted SYNC field at the central controller; $T_{SBD}$ is the propagation time of the wireless message; $T_{TD}$ is the delay of transmitter—the time delay introduced by the central controller transmitter before the signal is actually transmitted through its antenna; and $T_{RD}$ is the delay of the receiver—the time delay introduced by the SPPS receiver after the signal was actually received through its antenna. This time delay is the difference between the time stamp $T_4$ of the SYNC field and the time when the SYNC field has been received through the SPPS antenna. It should be noted that for $T_{TD}$, the time delay is the difference between the time stamp of the SYNC field and the time when the SYNC field has been transmitted through the central controller antenna. This delay depends on the transmitter implementation and the logic used to generate a pulse at the end of the SYNC field transmission. In one embodiment, this delay may be in the order of 10-20 μsec and it cannot be ignored. However, it is quite constant and can be accurately measured. According to one embodiment, the delay of the SPPS transmitter ($T_{TD}$) is calculated or measured and transmitted to a central controller in the transmitted message. It should be further noted that, as for $T_{TD}$, $T_{RD}$ depends on the receiver implementation and the logic used to generate a pulse at the end of the SYNC field reception. In one embodiment, this delay may be in the order of 10-20 μsec and it cannot be ignored. However, it is also quite constant and can be accurately measured. According to one embodiment, the delay of the SPPS receive ($T_{RD}$) may be programmed into the SPPS during the manufacturing process. The periodic values of $T_{offset}$ are used by the SPPS to maintain time tracking and synchronization to the central controller time base as previously explained. Following the calculation of $T_{offset}$ at S846, at S848 it is determined whether the execution should continue with S830 if the SPPS is ready to receive a new SYNC message; otherwise, execution terminates.

Figure 9A:
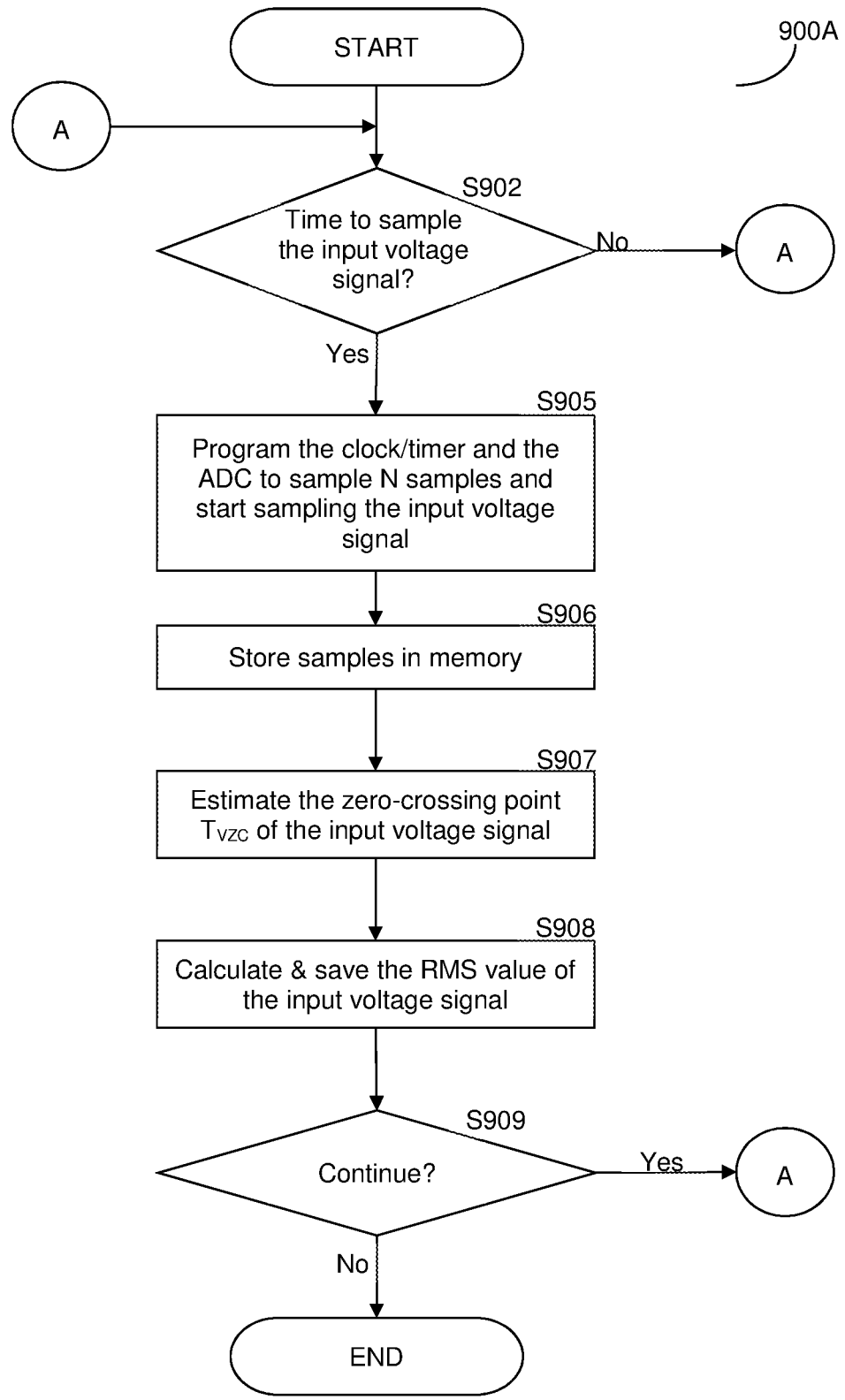
FIG. 9A is a flowchart of a method for calculating RMS values of a voltage signal according to an embodiment.
Figure 9B:
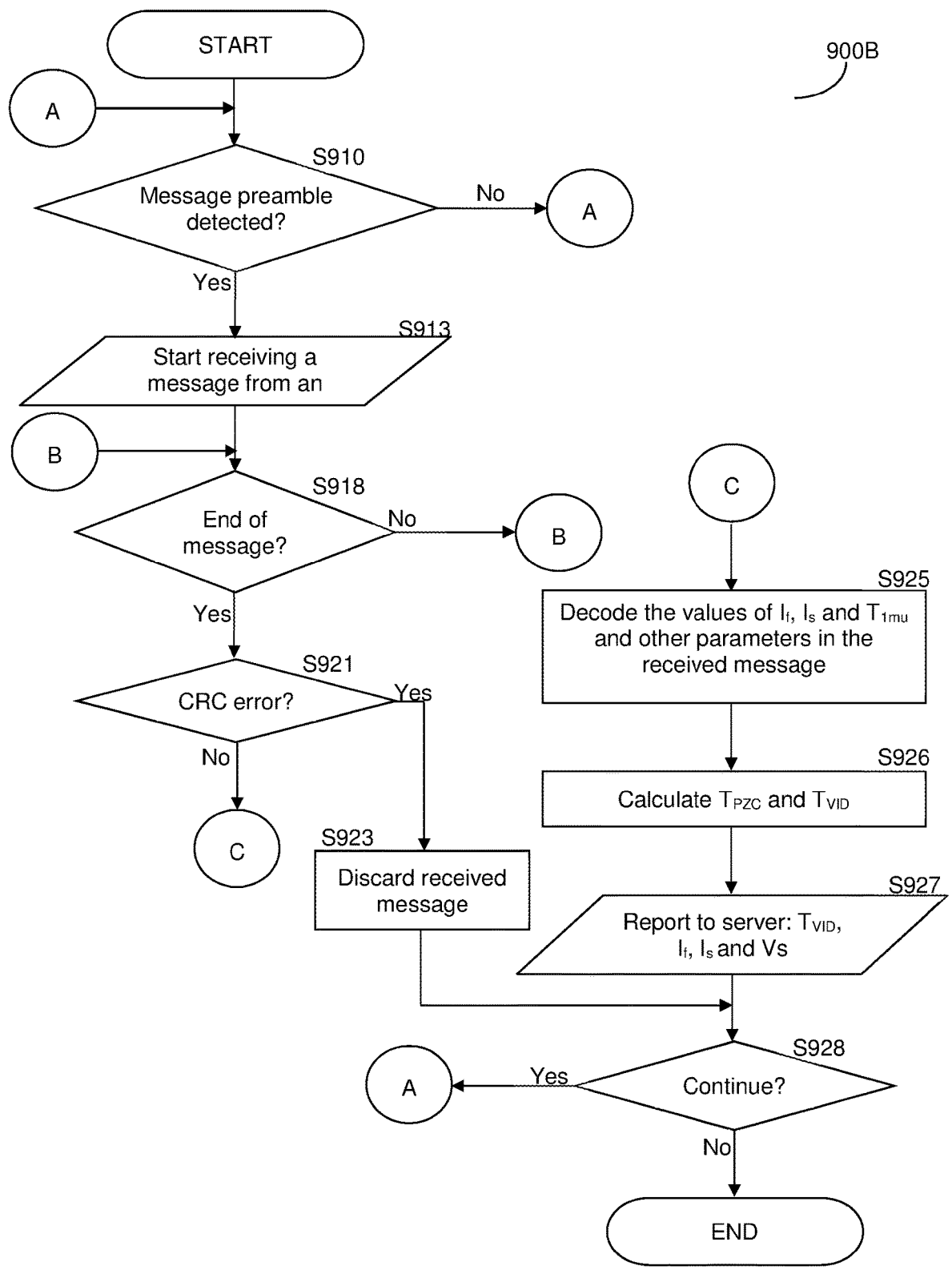
FIG. 9B is a flowchart of a method for receiving data from an SPPS according to an embodiment.
Figure 9C:
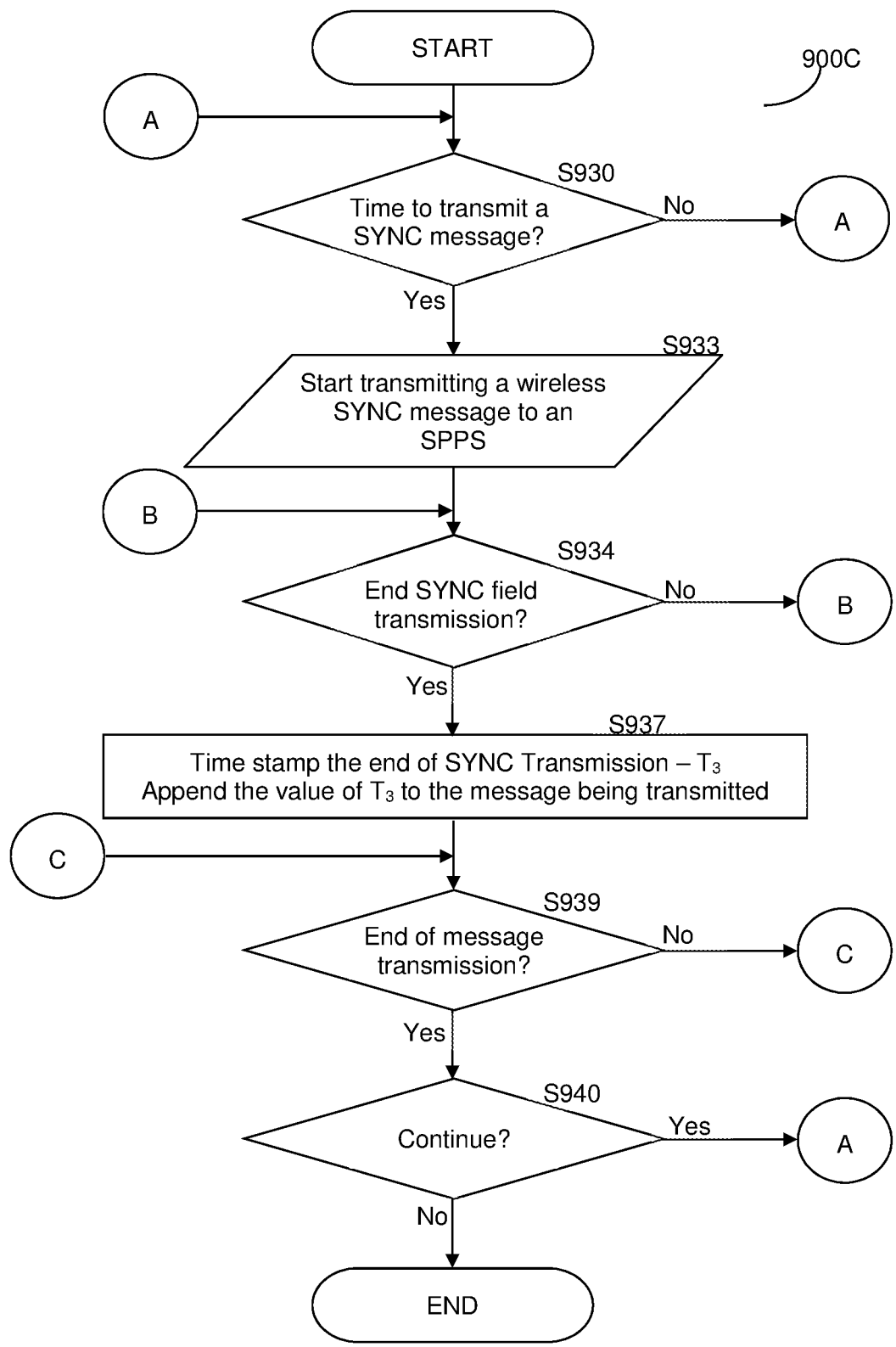
FIG. 9C is a flowchart of a method for transmitting a SYNC message from a central controller to an SPPS according to an embodiment.

FIG. 9A is a flowchart of a method 900A for calculating RMS values of a voltage signal according to an embodiment. FIG. 9B is a flowchart of a method 900B for receiving data from an SPPS to a central controller according to an embodiment. FIG. 9C is a flowchart of a method 900C for transmitting a SYNC message from a central controller to a SPPS according to an embodiment. As should be apparent to those skilled in the art, the flowcharts only describe those elements that are needed to explain the methods while other elements are omitted merely for the sake of clarity. The three methods 900A, 900B and 900C are explained herein separately but it should be understood, as may be apparent to the skilled in the art, that in a real implementation, these three methods may be executed concurrently, typically by an operating system capable of the management of several tasks.

Now referring to FIG. 9A, at S902 it is determined if it is time to start sampling the input voltage signal. If so, at S905 the clock or timer and an ADC is configured to start sampling the input voltage signal. After N samples (e.g., 64 samples for a 50 Hz signal) are measured, they are stored in a memory, e.g., the memory of MC 502, at S906.

At S907 the time of the start of the input signal cycle ($T_{VZC}$) is estimated. This is based on the time when the sampling process began. The start of this sampling process is triggered by the clock or timer itself (i.e., not by an MC command). The outcome of this hardware trigger is having an accurate time stamp of the new samples, limited only by the clock or timer accuracy. According to one embodiment, at S908 the RMS value $V_s$ of the input voltage signal is calculated. Thereafter, at S909 it is determined whether to continue and if so execution continues with S902; otherwise, execution ceases.

Now referring to FIG. 9B, at S910 it is determined if a new wireless message from an SPPS has been received. According to one embodiment, the central controller's transceiver has a half-duplex architecture which avoids transmitting and receiving wireless messages simultaneously. As may be apparent to one skilled in the art, the specific timing for the transmission or reception of messages may be handled by the central controller operating system and is beyond the scope of this description. The message reception is typically handled by the transceiver of central controller without the MC intervention. Thus, when a message preamble is detected at S910, the message is receiving at S913, e.g., by the transceiver over a wireless transmission from an SPPS. Following the receipt of the message, it is determined if the message has been received successfully without uncorrectable errors, e.g., cyclic redundancy code (CRC) errors at S921. If the received message contains uncorrectable errors, then the received message is discarded at S923 and execution continues with S928. If the received message has no errors, then the values of $T_{1mu}$, $I_s$ and $I_f$ as well as other parameters are decoded at S925. According to one embodiment, at S926 the time stamp of the zero-crossing of the primary current signal in the SPPS is calculated according to the central controller time base. The calculation is as follows:

$$T_{Pzc} = T_{1mu} + T_{cycle} - T_{CTD} - T_{FD}$$

where $T_{PZC}$ is the zero-crossing time stamp of the primary input signal of the SPPS, the time stamp is according to the central controller time base (timer); $T_{1mu}$ is the $T_1$ time stamp according to the central controller (i.e., $T_1$ time as it would be time stamped by the central controller 500); $T_{cycle}$ is the cycle time of the input signal (e.g., 20 msec for a 50 Hz signal); $T_{CTD}$ is the time delay of the current transformer; and $T_{FD}$ is the time delay of the SPPS filter (if used).

Now, having the $T_{Pzc}$ and $T_{VZC}$ time stamps, it can be further calculated at S926 (e.g., by the central controller) the time delay between the current and voltage signals as follows:

$$T_{VID} = T_{VZC} + T_{cycle} - T_{Pzc}$$

where: $T_{VID}$ is the time difference between the zero-crossing time stamp of the input voltage signal and the primary input current signal, where the time stamp is according to the central controller time base (timer); $T_{VZC}$ is the zero-crossing time stamp of the input voltage signal in the central controller; $T_{PZC}$ is the zero-crossing time stamp of the primary input signal in the SPPS, where the time stamp is according to the central controller time base (timer); and $T_{cycle}$ is the cycle time of the input signal (e.g. 20 msec for a 50 Hz signal).

Since the time stamp of the input voltage $T_{VZC}$ may be performed by the central controller after or before the calculated time stamp of the input current $T_{Pzc}$, the calculated value $T_{VID}$ may require an adjustment as follows (e.g., if it is determined that the delay cannot be more than $+/-0.25*T_{cycle}$): if $T_{VID} < 0$, then add an integer number of quarter cycles (i.e. $N*0.25*T_{cycle}$) until the number is positive and $< 0.25*T_{cycle}$; if $T_{VID} > 0.25*T_{cycle}$, then an integer number of quarter cycles (i.e. $N*0.25*T_{cycle}$) is subtracted until the resulting number is positive and $< 0.25*T_{cycle}$; and, if $0 \leq T_{VID} \leq 0.25*T_{cycle}$, then no need to adjust $T_{VID}$. In one embodiment, the cycle time of the input voltage signal (i.e., line frequency) may be estimated based on the time stamped samples. Since the line frequency is not expected to change within short intervals of time, this estimation may be performed at intervals of minutes or more. Execution ends at S927 where the values of $T_{VID}$, $I_s$ and $I_f$ of the input current signal and $V_s$ of the input voltage signal are reported, e.g., to a server. These values allow the server to calculate the power factor $\cos(\phi)$. Once the reporting to the server is completed, it is checked at S928 whether it is necessary to continue, and if so the method returns to S910 for the reception of a new SPPS 100 message; otherwise, execution terminates.

Now referring to FIG. 9C, at S930 it is determined if a SYNC message is to be transmitted, e.g., to an SPPS. If so, execution continues at S933 where the SYNC message is transmitted, e.g., to the SPPS. At S934 it is checked whether the end of the transmission of SYNC field of the message has occurred and while it has not, it remains in the same state; once the end of the SYNC field has been transmitted, at S937 a time-stamp of the end of SYNC transmission is appended to the message and referred to herein as $T_3$. At S939 it is checked whether the end of the transmission has been reached and if not it remains in S939 (a wait state); otherwise execution continues to S940 where it is determined if it is necessary to send another SYNC message. If so execution continues with S930; otherwise, execution terminates.

Figure 10:
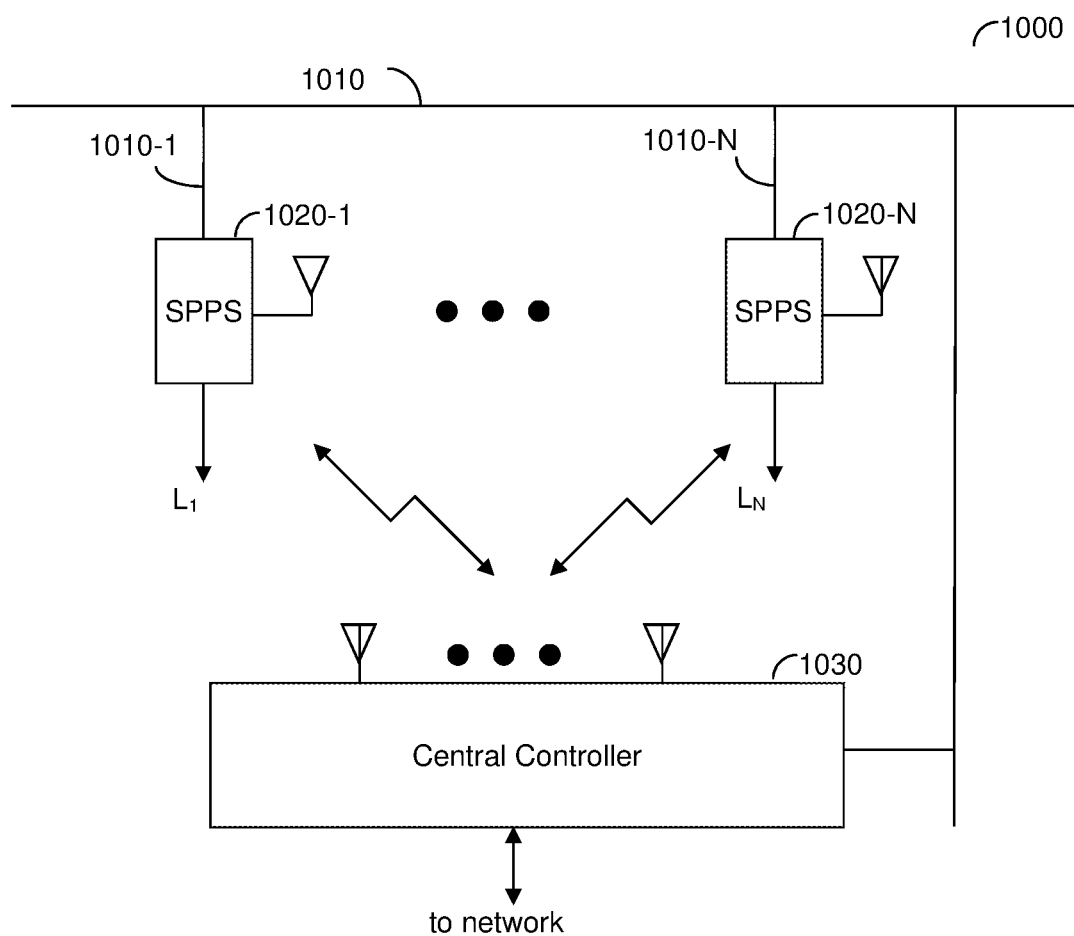
FIG. 10 is a block diagram of a system of a plurality of SPPSs wirelessly connected to a central controller according to an embodiment.

FIG. 10 is a block diagram of a system 1000 including a plurality of SPPSs 1020 wirelessly connected to a central controller 1030 according to an embodiment. The SPPS 1020-1 to 1020-N, where N is a positive integer, may be, for example, any one of the SPPSs shown in FIGS. 1 through 3, or others that may be adapted to perform the teachings of the instant disclosure. A power line 1010 distributes current to the plurality of SPPS 1020-1 through 1020-N through distribution lines 1010-1 through 1010-N respectively. A portion of each of the distribution lines 1010-1 through 1010-N that run through the core of their respective SPPSs 1020-1 through 1020-N act as a respective primary winding. Thereafter the line provides the current to respective loads (not shown) marked as $L_1$ through $L_N$. The SPPSs 1020 are wirelessly connected to a central controller 1030, the operation of which has been discussed in detail elsewhere herein, for the transfer of packets with information of both electrical parameters and timing information. The central controller 1030 is further connected to the power line 1010 for the purpose of sampling the voltage signal as discussed in more detail elsewhere herein. In one embodiment the central controller may be further connected to a network, which may include, but is not limited to a local area network (LAN), wide area network (WAN), metro area network (MAN), the Internet, the worldwide web (WWW), wired or wireless, and the like. The central controller 1030 may include a processing unit (not shown) and a memory (not shown) connected to the processing unit. More details are provided herein with respect of FIGS. 5 and 6. The memory may store therein a plurality of instructions that when executed by the processing unit perform the tasks described elsewhere herein. The central controller further includes one or more antenna for the wireless communication with the one or more SPPSs 1020.

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine including any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosed embodiment and the concepts contributed by the inventor to furthering the art and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A method for the wireless synchronization of a self-powered power sensor (SPPS) to a central controller for calculating a value of an electrical parameter, the method comprising:
    receiving, by the SPPS, from a central controller a wireless message that includes timing information of the central controller time base;
    sampling, by the SPPS, at least an electrical signal respective of a powerline connected to an SPPS;
    estimating, by the SPPS, from the samples of the at least an electrical signal at least a value of a first electrical parameter, where the value of the at least a first electrical parameter is adjusted using the timing information, where the at least a first electrical parameter is a zero-crossing time of the at least an electrical signal;
    generating, by the SPPS, a packet;
    appending, by the SPPS, to the packet the estimated at least a first electrical parameter; and
    transmitting, by the SPPS, the packet wirelessly to the central controller.

2. The method of claim 1, further comprising: estimating via the SPPS a value of at least a second electrical parameter from the sampled information.

3. The method of claim 2, further comprising: appending to the packet the value of the at least a second electrical parameter.

4. The method of claim 2, wherein the at least a second electrical parameter is a root mean square value of the at least an electrical signal.

5. The method of claim 1, wherein the at least an electrical signal is a current.

6. The method of claim 5, further comprising: receiving from the central controller at least timing information of a voltage signal.

7. The method of claim 6, further comprising: determining a phase offset between a current signal and the voltage signal; and appending the phase offset to the packet.

8. The method of claim 5, further comprising: determining a current distortion factor;
    and appending the current distortion factor to the packet.

9. A self-powered power sensor (SPPS) adapted to calculate a value of at least an electrical parameter, the SPPS comprising:
    a current transformer where a primary winding of the current transformer is configured to connect to a powerline;
    an analog-to-digital converter (ADC) connected to a secondary winding of the current transformer;
    a wireless transceiver;
    a processing unit connected to the ADC and adapted to:
    receive from a central controller a wireless message including timing information of the central controller time base;
    sample at least an electrical signal respective of a powerline;
    estimate from the samples of the at least an electrical signal at least a value of a first electrical parameter, where the value of the at least a first electrical parameter is adjusted using the timing information, where the at least a first electrical parameter is a zero-crossing time of the at least an electrical signal;
    generate a packet;
    append to the packet the estimated at least a first electrical parameter; and
    transmit the packet wirelessly to the central controller; and
    a clock connected to an oscillator, wherein the clock is connected to the ADC, the processing unit and the transmitter.

10. The SPPS of claim 9, wherein the processing unit is further adapted to estimate at least a value of a second electrical parameter from the sampled information.

11. The SPPS of claim 10, wherein the processing unit is further adapted to append to the packet the value of the at least a second electrical parameter.

12. The SPPS of claim 9, wherein the at least a second electrical parameter is a root mean square value of the at least an electrical signal.

13. The SPPS of claim 9, wherein the at least an electrical signal is a current.

14. The SPPS of claim 13, wherein the processing unit is further adapted to receive from the central controller at least a timing information of a voltage signal.

15. The SPPS of claim 14, wherein the processing unit is further configured to determine a phase offset between the current signal and the voltage signal and append the phase offset to the packet.

16. The SPPS of claim 13, wherein the processing unit is further configured to determine a current distortion factor and append the current distortion factor to the packet.

17. The SPPS of claim 9, further comprising: a low pass filter connected between the current transformer and the ADC.

18. The SPPS of claim 17, further comprising: a zero-cross detection circuitry connected to at least the low pass filter.

19. The SPPS of claim 17, wherein the low pass filter is at least one of: an analog low pass filter, a digital low pass filter, a matched filter, and a harmonic filter.

20. A central controller for providing information to and receiving information from a plurality of self-powered power sensors (SPPSs), the central controller comprising:
    an interface to accept a powerline for sampling a voltage signal of the powerline;
    a transceiver adapted to transmit wireless signals to the plurality of SPPSs and receive wireless signals from the plurality of SPPSs;
    a timer for determination of a time base of the central controller;
    a processing unit connected to the interface, the transceiver, the timer and a memory containing instructions that when executed by the processing unit adapt the central controller to:
    determine at least a voltage information respective of a voltage signal of the power line;

obtain timing information of the time base;

create a packet containing the timing information of the time base;

transfer the packet to the transmitter for wireless transmission to the plurality of SPPSs such that each SPPS may adjust its respective time base timing according to the timing information of the time base of the central controller;

receive from at least one SPPS from the plurality of SPPS a first electrical parameter and a second electrical parameter, where the at least a first electrical parameter is a zero crossing time; and determine a power factor based on the voltage signal, the first electrical parameter and the second electrical parameter; and one or more antennas connected to the transceiver for wireless communication with the plurality of SPPSs.

21. The central controller of claim 20, wherein the central controller is further adapted to have the processing unit determine a voltage distortion factor.

22. The central controller of claim 20, wherein the central controller is further adapted to have the processing unit determine a current distortion factor.

23. The central controller of claim 20, wherein the at least a first electrical parameter is a root mean square value of the at least an electrical signal.

24. The central controller of claim 21, wherein the at least an electrical signal is a current.

25. The central controller of claim 20, wherein the central controller is further adapted to have the processing unit determine a power factor.

26. The central controller of claim 20, wherein the at least a second electrical parameter is a root mean square value.

27. A non-transitory computer readable medium having stored thereon instructions for causing a processing circuitry of a self-powered power sensor (SPPS) to perform a process, the process comprising:

receiving from a central controller a message that includes timing information of the central controller time base;

sampling at least an electrical signal respective of a powerline connected to an SPPS;

estimating from the samples of the at least an electrical signal at least a value of a first electrical parameter, where the value of the at least a first electrical parameter is adjusted using the tinning information, where the at least a first electrical parameter is a zero crossing time;

generating a packet;

appending to the packet the estimated at least a first electrical parameter; and transmitting the packet to the central controller.

* * * * *